United States Patent
Perez Willard

(10) Patent No.: US 11,862,428 B2
(45) Date of Patent: Jan. 2, 2024

(54) PROCESSING AN OBJECT USING A MATERIAL PROCESSING DEVICE

(71) Applicant: Carl Zeiss Microscopy GmbH, Jena (DE)

(72) Inventor: Fabian Perez Willard, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 17/730,317

(22) Filed: Apr. 27, 2022

(65) Prior Publication Data

US 2023/0097540 A1 Mar. 30, 2023

(30) Foreign Application Priority Data

Apr. 28, 2021 (DE) .......................... 102021110948.5

(51) Int. Cl.
*H01J 37/305* (2006.01)
*H01J 37/30* (2006.01)

(52) U.S. Cl.
CPC ...... *H01J 37/3056* (2013.01); *H01J 37/3005* (2013.01)

(58) Field of Classification Search
CPC .......................... H01J 37/3056; H01J 37/3005
See application file for complete search history.

(56) References Cited

U.S. PATENT DOCUMENTS

| 6,335,129 B1* | 1/2002 | Asano ................. H01J 37/3056 430/5 |
| 7,547,560 B2* | 6/2009 | Patterson ................ H01L 22/20 257/E21.252 |
| 2004/0036031 A1 | 2/2004 | Rose et al. |
| 2011/0103681 A1 | 5/2011 | Kelly |

(Continued)

FOREIGN PATENT DOCUMENTS

WO    WO 02/067286 A2    8/2002

OTHER PUBLICATIONS

B. Tordoff et al., "The LaserFIB: new application opportunities combining a high-performance FIB-SEM with femtosecond laser processing in an integrated second chamber," Applied Microscopy 50 (2020), pp. 1-11.

(Continued)

*Primary Examiner* — Sean M Luck
(74) *Attorney, Agent, or Firm* — Muirhead and Saturnelli, LLC

(57) ABSTRACT

Processing an object using a material processing device with a particle beam apparatus includes determining a region of interest of the object on or in a first material region of the object, ablating material from a second material region adjoining the first material region using an ablation device, and recognizing a geometric shape of the first material region. The geometric shape has a center. Processing the object also includes ablating material from a second portion of the first material region adjoining a first portion using a particle beam, the first portion having a first subregion and (Continued)

a second subregion, the region of interest being arranged in the first subregion, recognizing a further geometric shape of the first material region, positioning the object such that the first position corresponds to a center of the further geometric shape, and ablating material from the second subregion using the particle beam.

26 Claims, 11 Drawing Sheets

(56) References Cited

U.S. PATENT DOCUMENTS

| | | | |
|---|---|---|---|
| 2011/0248164 A1 | 10/2011 | Straw et al. | |
| 2014/0017881 A1* | 1/2014 | Eaton | H01L 21/30655 |
| | | | 29/563 |
| 2014/0131195 A1 | 5/2014 | Bruland | |

OTHER PUBLICATIONS

M. Pfeifenberger et al., "The use of femtosecond laser ablation as a novel tool for rapid micro-mechanical sample preparation," Materials & Design 121 (2017), pp. 109-118.

McKenzie et al., "Focused ion beam sample preparation for atom probe tomography" in: A. Méndez-Vilas and J. Diaz (Eds.), Microscopy: Science, Technology, Applications and Education vol. 3 (Badajoz, Spain, 2010), pp. 1800-1810.

Gorman et al., "Development of Atom Probe Tomography with In-situ STEM Imaging and Diffraction", Microsc. Microanal. 17 (Suppl 2), 2011, pp. 710 f.

Guillaume Audoit et al., "FIB-SEM Fabrication of Atom Probe Specimens with ZEISS Crossbeam", Jena (Germany), Mar. 2021 ("application note").

* cited by examiner

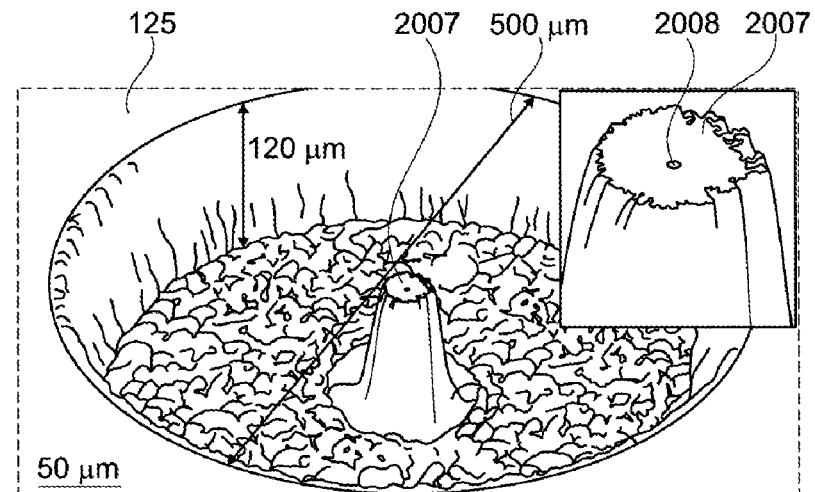
Fig. 11
Fig. 10
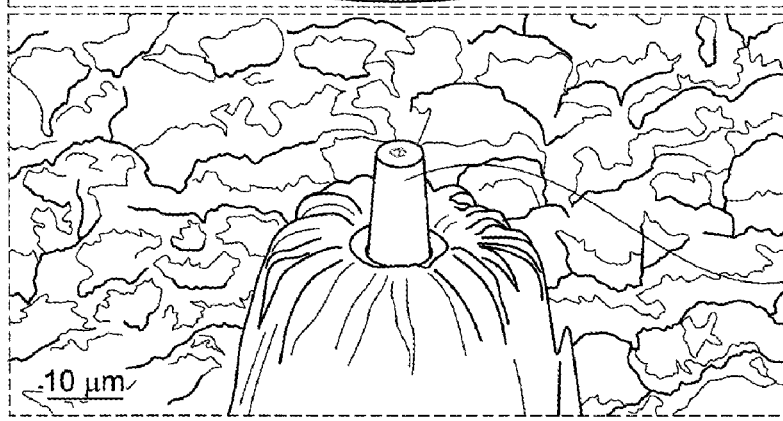
Fig. 15
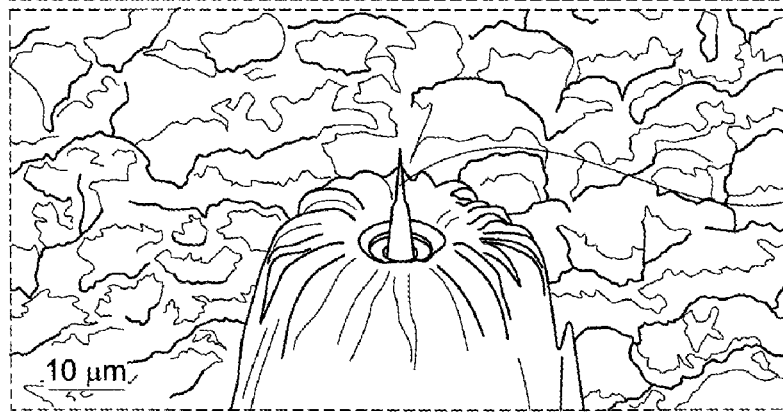
Fig. 16

PROCESSING AN OBJECT USING A MATERIAL PROCESSING DEVICE

CROSS REFERENCE TO RELATED APPLICATIONS

This application claims the priority of the German patent application No. 10 2021 110 948.5, filed on Apr. 28, 2021, which is incorporated by reference here.

TECHNICAL FIELD

The system described herein relates to processing an object using a material processing device that has a particle beam apparatus and more particularly to using a material processing device that has a particle beam apparatus in an automated, partly automated, manual fashion and/or using a computer program product and a material processing device.

BACKGROUND

Electron beam apparatuses, in particular a scanning electron microscope (also referred to as SEM below) and/or a transmission electron microscope (also referred to as TEM below), are used to examine objects (samples) in order to obtain knowledge in respect of the properties and the behavior under certain conditions.

In an SEM, an electron beam (also referred to as primary electron beam below) is generated using a beam generator and focused onto an object to be examined by way of a beam guiding system. The primary electron beam is guided in a raster manner over a surface of the object to be examined by way of a deflection device. Here, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An image representation of the object to be examined is thus obtained. Further, interaction radiation, for example x-ray radiation and cathodoluminescent light, is generated as a consequence of the interaction. In particular, the interaction radiation is used to analyze the object.

In the case of a TEM, a primary electron beam is likewise generated using a beam generator and focused on an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector (for example a camera) by a system consisting of an objective and a projection unit. Here, imaging can also take place in the scanning mode of a TEM. Usually, such a TEM is referred to as a STEM. Additionally, provision can be made for detecting electrons backscattered at the object to be examined and/or secondary electrons emitted by the object to be examined using a further detector in order to image an object to be examined.

Furthermore, it is known from the prior art to use combination apparatuses for examining objects, where both electrons and ions can be guided onto an object to be examined. By way of example, it is known to additionally equip an SEM with an ion beam column. An ion beam generator arranged in the ion beam column generates ions that are used for preparing an object (for example ablating material of the object or applying material to the object) or else for imaging. The SEM serves here in particular for observing the preparation, but also for further examination of the prepared or unprepared object.

In a further known particle beam apparatus, applying material to the object is carried out for example using the feed of a gas. The known particle beam apparatus is a combination apparatus that provides both an electron beam and an ion beam. The particle beam apparatus includes an electron beam column and an ion beam column. The electron beam column provides an electron beam that is focused onto an object. The object is arranged in a sample chamber kept under vacuum. The ion beam column provides an ion beam that is likewise focused onto the object. By way of example, a layer of the surface of the object is removed using the ion beam. After the layer has been removed, a further surface of the object is exposed. Using a gas feed device, a gaseous precursor substance—a so-called precursor—can be admitted into the sample chamber. It is known to form the gas feed device with an acicular device, which can be arranged quite close to a position of the object at a distance of up to a few hundred μm, such that the gaseous precursor substance can be guided to this position as accurately as possible and with a high concentration. As a result of the interaction of the ion beam with the gaseous precursor substance, a layer of a substance is deposited on the surface of the object. By way of example, it is known for gaseous phenanthrene to be admitted as gaseous precursor substance into the sample chamber using the gas feed device. Essentially a layer of carbon or a carbon-containing layer is then deposited on the surface of the object. It is also known to use a gaseous precursor substance that includes metal in order to deposit a metal or a metal-containing layer on the surface of the object. However, the depositions are not limited to carbon and/or metals. Rather, any desired substances can be deposited on the surface of the object, for example semiconductors, non-conductors or other compounds. Furthermore, it is known for the gaseous precursor substance to be used for ablating material of the object upon interaction with a particle beam.

The application of material on the object and/or the ablation of material from the object is used for arranging a marking on the object, for example. In the prior art, the marking is used, for example, for positioning the electron beam and/or the ion beam.

The prior art has disclosed atom probe tomography, which is a quantitative analyzing method for determining the distribution of elements in an object. In atom probe tomography, an object is examined which has a tip with a tip radius of the order of 10 nm to 100 nm, for example. An electric field with a voltage whose field strength does not suffice to bring about a detachment of atoms from the tip is applied to the tip. Now a short voltage pulse is applied to the tip in addition to the aforementioned voltage. This causes an increase in the field strength, the latter then being sufficient to detach individual ions at the tip by field evaporation. The use of a short laser pulse as an alternative to the short voltage pulse is also known. An atom that has been detached as an ion is steered to a position-sensitive detector by the electric field. Since the time of the voltage pulse or the laser pulse is known, the time at which the ion was detached from the tip is also known. A time of flight of the ion from the tip to the position-sensitive detector, which is to be determined, then can be used to determine the mass of the ion, more precisely the ratio of mass to charge number of the ion. The x- and y-position of the atom at the tip can be determined from the location of incidence of the ion on the position-sensitive detector. The z-position of the atom in the tip is determined with knowledge of the evaporation sequence carried out. Expressed differently, ions striking the position-sensitive detector at a later time are arranged further within the tip than ions striking the position-sensitive detector at an earlier time.

By way of example, the object with the tip may have been produced electrochemically. Producing the object with the tip in a combination apparatus that has an electron beam column and an ion beam column is also known. In particular, provision is made for the tip of the object to be produced by ablating material of the object using an ion beam. Imaging with the electron beam is used to observe the ablation of the material. In this case, the tip should have a region of interest that should be analyzed in more detail using atom probe tomography. By way of example, the region of interest is a precipitate, a pore, an impurity phase, an interface or a defect of a component. When the tip of the object is produced using the ion beam, a material piece of the object is uncovered from the object using the ion beam. Then, the material piece can optionally be separated from the object using the ion beam and fastened to an object holder. The tip is produced from the material piece of the object by using the ion beam to ablate material.

To ensure that the region of interest is in fact arranged at or in the tip, it is desirable for the ion beam to be positioned sufficiently well relative to the object. The application of a reference marking to the object in order to achieve this is known, the reference marking generally being arranged at a distance of the order of a few to several 10 μm from what will become the tip of the object. The reference marking is imaged using the electron beam or using the ion beam. Expressed differently, images containing the reference marking are generated. An image cross correlation, known from the prior art, can be carried out using the generated images such that the ion beam can be positioned sufficiently well relative to the object. A drift of the object in relation to the ion beam is recognized as a result, and so the relative position of the ion beam in relation to the object can be readjusted where necessary.

SUMMARY OF THE INVENTION

Although producing a tip of the object using an ion beam is very accurate, it often takes a few hours or even a few days to produce the tip of the object on account of the ablation rates of no more than several 1000 μm³ material per second. This is particularly the case should material of the object that surrounds the tip be ablated extensively over a radius of the order of several 100 μm. It is therefore desirable to bring about the extensive material ablation using, e.g., a laser and subsequently only still carry out fine ablations of the material of the order of several μm with the ion beam for the purposes of producing the tip of the object. This would significantly reduce the time required to produce the tip of the object. However, it is quite difficult in that case to use the aforementioned reference marking for the purposes of orienting the ion beam with respect to the object since the reference marking will also be ablated as a result of an extensive ablation of material of the object, and will consequently no longer be able to be used for orientation purposes.

The system described herein includes a method for processing an object, a computer program product and a material processing device which, firstly, render performable both extensive ablation of material of an object, for example of the order of several 100 μm, and fine ablation of material of the order of several nm, and, secondly, facilitate adequate relative positioning of a particle beam with respect to the object for the purposes of processing the object.

According to the system described herein, an object is processed using a material processing device. Material of the object can be processed using the material processing device. By way of example, the method is carried out in automated, partly automated or manual fashion. Therefore, individual, multiple or all method steps, for example, may be carried out automatically and/or manually. In particular, the material is ablated from the object and/or material is applied to the object. In particular, the material processing device includes a particle beam apparatus, a laser device, a mechanical ablation device and/or an ion beam device. This is discussed in more detail below.

In the method according to the system described herein, a region of interest of the object arranged on or in a first material region of the object is determined using a determination device of the material processing device. Expressed differently, the position of the region of interest is determined (that is to say identified and/or chosen) in or on the object. By way of example, the region of interest is a precipitate in the material of the object, a pore in the material of the object, an impurity phase in the material of the object, an interface in the material of the object or a defect in the material of the object. Examples of how the region of interest of the object is determined using the determination device are explained in more detail below.

Further, material of a second material region of the object is ablated within the scope of the method according to the system described herein using an ablation device of the material processing device. Examples of the ablation device are explained in more detail below. The second material region adjoins the first material region. By way of example, the second material region encompasses the first material region, at least in part or in full. In particular, the method according to the system described herein provides for the material of the second material region of the object to be ablated extensively in a few ablation steps, for example of the order of several 100 μm. Expressed differently, the material in the second material region of the object is ablated in a few coarse steps within the scope of the method step of the method according to the system described herein, and so an extensive structure is generated in the object. By way of example, the structure has external dimensions of the order of several 100 μm.

Further, provision is made for the first material region to have a first portion and a second portion that adjoins the first portion. The region of interest of the object is arranged in the first portion. This is discussed in more detail below. By way of example, the second portion encompasses the first portion, at least in part or in full.

In the method according to the system described herein, a geometric shape of the first material region is recognized and/or determined, following the ablation or during the ablation of the material of the second material region, in a plan view of the first material region using a control device of the material processing device. By way of example, an image and/or pattern recognition method known from the prior art may be used to this end. Expressed differently, the control device of the material processing device is used to determine the geometric shape of the first material region in a plan view of the first material region, following the ablation or during the ablation of the material of the second material region. Hereinbefore and hereinafter, a plan view of the first material region is understood to mean any observation of the first material region carried out with a viewing angle ranging from 0° to 90° with respect to the first material region, the aforementioned interval limits being included. By way of example, the geometric shape is recognized on the basis of an image representation of the first material region created using the particle beam or a further particle beam of the particle beam apparatus. By way of example, the particle beam and/or the further particle beam are embodied as an electron beam and/or an ion beam. The geometric shape has a center, more particularly a centroid. The center is arranged at a first position. Expressed differently, the center has a first relative position in space. By way of example, a circular ring is used as geometric shape. Explicit reference is made to the fact that the invention is not restricted to the aforementioned geometric shapes. Rather, any geometric shape suitable for the invention can be used by the invention, in particular a polygon, a partially open polygon or a bar structure as well.

Now, the following applies with regard to the center:

By way of example, either (i) the region of interest is arranged at the center of the geometric shape or (ii) a projection of the region of interest on a surface of the first material region is arranged at the center of the geometric shape applies firstly. Should the region of interest be arranged in the first material region of the object (i.e., be arranged in the interior of the first material region of the object), provision is for example made for the projection of the region of interest on the surface of the first material region to be arranged at the center of the geometric shape.

Secondly, should the region of interest or the projection of the region of interest on the surface of the first material region not be arranged at the center of the geometric shape, the region of interest or the projection of the region of interest on the surface of the first material region is defined as the center of the geometric shape and the geometric shape is arranged around the defined center.

Expressed differently, (a) the region of interest or a projection of the region of interest is already arranged at the center of the geometric shape or (b) the region of interest or a projection of the region of interest is defined as the center, about which the geometric shape is arranged.

By way of example, the aforementioned projection is a perpendicular projection of the region of interest on the surface of the first material region. In an alternative, the projection is a projection of the region of interest on the surface of the first material region at any definable angle.

Further, the method according to the system described herein includes ablating material from the second portion of the first material region using a particle beam of a particle beam apparatus, for example an ion beam of an ion beam apparatus. By way of example, the geometric shape of the first material region is substantially maintained, but possibly with smaller dimensions, while the material is ablated from the second portion. Expressed differently, material is ablated from the second portion of the first material region using the particle beam of the particle beam apparatus, with ablation of material from the first portion of the first material region not being envisaged. Accordingly, no material is ablated from the region in which the region of interest is arranged (i.e., from the first portion of the first material region). By way of example, the material of the second portion of the first material region is ablated along the recognized geometric shape or along any other desired geometric shape. Expressed differently, the material is for example ablated from the second portion in such a way that the material is ablated from the second portion in the shape of the geometric shape or any other desired geometric shape. In particular, provision is made for the material of the second portion to be ablated in the shape of a circular ring or a hollow cylinder. In principle, the first portion of the first material region is exposed by ablating the material from the second portion of the first material region, the region of interest being arranged in the first portion of the first material region. The first portion has a first subregion and a second subregion, the region of interest being arranged in the first subregion. The first subregion adjoins the second subregion. By way of example, the second subregion encompasses the first subregion in part or in full.

In the method according to the system described herein, a further geometric shape of the first material region is also recognized, following the ablation and/or during the ablation of the material from the second portion, in a plan view of the first material region using the control device of the material processing device. By way of example, an image and/or pattern recognition method known from the prior art is used to this end. Expressed differently, the control device of the material processing device is used to determine the further geometric shape of the first material region in a plan view of the first material region, following the ablation and/or during the ablation of the material from the second portion. By way of example, the further geometric shape is recognized on the basis of an image representation of the first material region created using the particle beam or a further particle beam of the particle beam apparatus. By way of example, the particle beam and/or the further particle beam are/is embodied as an electron beam and/or ion beam. In particular, the further geometric shape is the outer shape of the first material region remaining following the ablation of the material from the second portion, and/or the further geometric shape is for example a marking of the region of interest or of the aforementioned projection of the region of interest. The further geometric shape has a further center, the further center being arranged at a second position. There is positioning the object using a moveable object holder of the material processing device and/or positioning the particle beam using the particle beam apparatus, in such a way that the first position of the center corresponds to the second position of the further center so that one of the following features is provided in respect of the further center: (i) the region of interest is arranged at the further center of the further geometric shape or (ii) the projection of the region of interest on the surface of the first material region is arranged at the further center of the further geometric shape. Further, material is ablated from the second subregion of the first material region using the particle beam of the particle beam apparatus, the material of the second subregion of the first material region being ablated for example along the further geometric shape or any further desired geometric shape. The first subregion is not ablated.

Firstly, the system described herein ensures extensive ablation of material of the object, for example of the order of several 100 µm using the ablation device. In particular, the system described herein ensures that the material of the second material region of the object is ablated extensively in a few ablation steps, for example of the order of several 100 µm. Expressed differently, the material in the second material region of the object is ablated in a few coarse steps within the scope of the method according to the system described herein and so an extensive structure is generated in the object. By way of example, the structure has external dimensions of the order of several 100 µm. Secondly, the system described herein ensures fine ablation of material from the second portion of the first material region of the order of several nm to a few µm using the particle beam of the particle beam apparatus, the fine ablation being automatically performable in particular. The first portion is not ablated. The region of interest is arranged in the first portion. Consequently, the time taken for production of a desired shape of the object, for example a tip of the object for the purposes of analysis using atom probe tomography, can be reduced in comparison with the prior art, for example to a few hours or less. Further, the geometric shape of the first material region recognized according to the system described herein and the arrangement of the region of interest, or the projection of the region of interest on the surface of the object, at the center of the geometric shape allow the facilitation of adequate relative positioning in particular of the particle beam in relation to the object, without a reference marking known from the prior art, which is arranged on the object at a distance from the region of interest of the order of several 10 µm or less, necessarily having to be arranged on the object.

The system described herein ensures a production of any desired shape of the object by processing the object within a relatively short period of time, in particular a production of a tip-shaped form of the object which is then analyzable using atom probe tomography, for example.

The system described herein also takes into account that the object is processed multiple times for the purposes of producing a desired shape of the object. On account of mechanical and/or electronic drifts of components of the material processing device, the relative position of the region of interest may change in relation to the particle beam of the particle beam apparatus while the method according to the system described herein is carried out. If the object is processed multiple times, this may possibly lead to a non-desired shape of the object being produced following processing without appropriate drift correction. As a result of recognizing the geometric shapes and arranging the center of the geometric shapes at a position, the system described herein, in particular, provides a solution that considers such drifts without use of a reference marking being mandatory.

An embodiment of the method according to the system described herein additionally or alternatively provides for only material from the second portion and/or from the second subregion of the first material region to be ablated using the particle beam of the particle beam apparatus. Expressed differently, it is only material from the second portion and/or the second subregion of the first material region that is ablated using the particle beam of the particle beam apparatus, and not material from the first portion and/or the first subregion of the first material region, in which the region of interest is arranged.

A further embodiment of the method according to the system described herein additionally or alternatively provides for the region of interest to be determined using the determination device with specified data about the object or with data of an object model. By way of example, this embodiment of the method according to the system described herein is used if the structural build of the object is known or approximately known. Then it is, for example, possible to accurately determine or approximately determine the position of the region of interest in or on the object. By way of example, the determined or suspected position of the region of interest is input into the determination device.

An even further embodiment of the method according to the system described herein additionally or alternatively provides for the region of interest to be determined using the determination device to provide a non-destructive examination. By way of example, the determination device includes an x-ray device, an ultrasound device and/or a lock-in thermography device used for determining the region of interest. Expressed differently, the position of the region of interest is determined in or on the object.

An embodiment of the method according to the system described herein additionally or alternatively provides for the ablation device to include a laser device and for the material to be ablated from the second material region using the laser device. In addition or as an alternative thereto, provision is made for the ablation device to have a mechanical ablation device. By way of example, the mechanical ablation device is embodied as a microtome. In addition or as an alternative thereto in turn, provision is made for the ablation device to include an ion beam device with a high-current ion beam (for example ranging from 1 nA to 10 µA, the interval limits being included in the aforementioned interval) or a plasma ion beam device with a plasma beam generator, and for the ablation of the material from the second material region to be implemented using the ion beam device or the plasma ion beam device. In addition or as an alternative thereto in turn, provision is made for the ablation device to have a beam device with a beam of neutral particles and for the material to be ablated from the second material region using the beam device. Alternatively or in addition, provision is also made for the ablation device to have an etching device for chemical etching and for the material to be ablated from the second material region using the etching device. The aforementioned embodiments of the method according to the system described herein facilitate an extensive ablation of material of the object, in particular from the second material region, with a few ablation steps of the order of several 100 µm.

A further embodiment of the method according to the system described herein additionally or alternatively provides for an at least partly cylindrical material region to be used as the first material region. In addition or as an alternative thereto, provision is made for an at least partly conical material region to be used as the first material region. In addition or as an alternative thereto in turn, provision is made for an at least partly ring-shaped material region and/or an at least partly hollow cylindrical material region to be used as the second material region.

Yet a further embodiment of the method according to the system described herein additionally or alternatively provides for a two-dimensional shape to be used as the geometric shape and/or the further geometric shape for the first material region. By way of example, the two-dimensional shape is a circular ring and/or a frame-shaped structure (i.e., basically a polygonal shape equivalent to the circular ring). However, the invention is not restricted to the aforementioned two-dimensional shapes. Rather, any two-dimensional shape which is suitable for the invention can be used for the invention. In addition or as an alternative thereto in turn, provision is made for a central point and/or a centroid to be used as the center of the geometric shape or of the further geometric shape. By way of example, the centroid is a centroid of an area. In addition or as an alternative thereto, provision is made for a point in the interior of the geometric shape and/or in the interior of the further geometric shape to be used as the center of the geometric shape and/or as the further center of the further geometric shape, the point having a predetermined position relative to an edge of the geometric shape and/or of the further geometric shape.

Yet a further embodiment of the method according to the system described herein additionally or alternatively provides for the particle beam apparatus to have an ion beam apparatus and for an ion beam of the ion beam apparatus to be used for ablating the material from the second portion of the first material region. By way of example, the ion beam includes gallium ions. Explicit reference is made to the fact that the invention is not restricted to gallium ions. Rather, any ions which are suitable for the invention can be used as ions. The ion beam ensures fine ablation of material from the second portion of the first material region, of the order of a few nm to µm. The first portion of the first material region, in which the region of interest is arranged, is not ablated.

An embodiment of the method according to the system described herein additionally or alternatively provides for at least one marking to be arranged on the first material region in the center of the geometric shape using the particle beam or a further particle beam of the particle beam apparatus. In contrast to the prior art, no marking is arranged on the object at a distance of an order of up to several 10 µm from the region of interest. Instead, the marking according to the system described herein is arranged at the center of the geometric shape on the region of interest or on the projection of the region of interest on the surface of the first material region of the object. As mentioned above, for example the perpendicular projection of the region of interest on the surface of the first material region is arranged at the center of the geometric shape. To be able to identify this better in an image representation of the object, the marking on the first material region is arranged at the center of the geometric shape using the particle beam. By way of example, additional or alternative provision is made for a material deposition to be used as a marking, the material deposition being arranged on the first material region using the particle beam of the particle beam apparatus, optionally using a gas feed device. As a further addition or alternative thereto, provision is made for a material ablation to be used as a marking, the material ablation being produced in the first material region using the particle beam of the particle beam apparatus, optionally using a gas feed device.

A further embodiment of the method according to the system described herein additionally or alternatively provides for the object to be positioned using the moveable object holder and/or the particle beam to be positioned using the particle beam apparatus following the recognition of the geometric shape of the first material region, in such a way that the particle beam is directed at the center of the first material region. In particular, provision is made for the object and/or the particle beam to be positioned using at least one structure that has arisen when ablating the material from the second material region of the object using the ablation device, the structure being formed as a marking. Expressed differently, at least one structure is used as a marking in this embodiment of the method according to the system described herein, in order to position the object and/or the particle beam, to be precise in such a way that, for example, the particle beam is directed at the center of the first material region.

In yet a further embodiment of the method according to the system described herein, additional or alternative provision is made for the object to be analyzed and/or the method to be stopped, that is to say halted, after a final shape of the first material region has been obtained.

None of the described embodiments of the method according to the invention are restricted to the aforementioned sequence of the explained method steps. Rather, any sequence of the aforementioned method steps suitable for the invention can be chosen in the method according to the invention.

The system described herein also relates to a computer program product that includes a program code which is loadable or loaded into a processor of a material processing device, in particular of a particle beam apparatus, the program code, when executed in the processor, controlling the material processing device in such a way that a method having at least one of the aforementioned or following features or having a combination of at least two of the aforementioned or following features is carried out.

The system described herein also relates to a material processing device for processing an object. The material processing device according to the system described herein, explained here and also further above in relation to the method, is not necessarily embodied as a single apparatus. Rather, provision is made, for example, for the material processing device according to the system described herein to be embodied as a system, the latter including a plurality of apparatuses and/or devices of equipment, the plurality of apparatuses not necessarily needing to be arranged at one location. However, the plurality of apparatuses may be arranged at one location, for example. The material processing device according to the system described herein includes at least one object holder for arranging the object. By way of example, the object holder is moveable. Moreover, the material processing device according to the system described herein includes at least one determination device for determining a region of interest of the object. By way of example, the determination device is designed such that the position or the suspected position of a region of interest is able to be entered into the determination device. Alternatively, provision is made for data from an external determination device to be able to be read into the material processing device. In addition or as an alternative thereto, the determination device includes a device for non-destructive examination of the object for the purposes of determining a region of interest. In particular, provision is made for the determination device to include an x-ray device, an ultrasound device and/or a lock-in thermography device that determines the region of interest. Expressed differently, the position of the region of interest in the object is determined using the aforementioned determination device.

The material processing device according to the system described herein also includes at least one ablation device for ablating material. Examples of the ablation device are explained in more detail below. Moreover, the material processing device according to the system described herein includes at least one particle beam apparatus with at least one beam generator for generating a particle beam with charged particles. The charged particles are electrons or ions, for example. Further, the particle beam apparatus includes at least one objective lens for focusing the particle beam on the object, at least one scanning device for scanning the particle beam over the object, at least one detector for detecting interaction particles and/or interaction radiation arising from an interaction of the particle beam with the object, and at least one display device for displaying an image and/or an analysis of the object. By way of example, as a consequence of the interaction, in particular, particles are emitted by the object (so-called secondary particles, in particular secondary electrons) and particles of the particle beam are backscattered (so-called backscattered particles, in particular backscattered electrons). The secondary particles and backscattered particles are detected and used for image generation. An image representation of the object to be examined is thus obtained. Further, interaction radiation, for example x-ray radiation and cathodoluminescent light, is generated as a consequence of the interaction. In particular, the interaction radiation is used to analyze the object.

The material processing device according to the system described herein also includes at least one control unit having a processor in which a computer program product having at least one of the aforementioned or following features or having a combination of at least two of the aforementioned or following features is loaded.

In an embodiment of the material processing device according to the system described herein, provision is made, additionally or alternatively, for the ablation device to include at least one laser device and/or a mechanical ablation device. By way of example, the mechanical ablation device is embodied as a microtome. In addition or as an alternative thereto in turn, provision is made for the ablation device to include an ion beam device with a high-current ion beam (for example ranging from 1 nA to 10 µA, the interval limits being included in the aforementioned interval) or a plasma ion beam device with a plasma beam generator. In addition or as an alternative thereto, provision is made for the ablation device to include a beam device with a beam of neutral particles and/or an etching device for chemical etching.

In a further embodiment of the material processing device according to the system described herein provision is additionally or alternatively made for the beam generator of the particle beam apparatus to be embodied as a first beam generator and for the particle beam to be embodied as a first particle beam with first charged particles. Further, the objective lens of the particle beam apparatus is embodied as a first objective lens for focusing the first particle beam on the object. Moreover, the particle beam apparatus of the material processing device according to the system described herein includes at least one second beam generator for generating a second particle beam including second charged particles. The second charged particles are ions or electrons, for example. Further, the particle beam apparatus includes at least one second objective lens for focusing the second particle beam onto the object.

In particular, provision is made for the material processing device to be embodied as an electron beam apparatus and/or ion beam apparatus. In addition or as an alternative thereto, provision is made for the material processing device to be embodied as the particle beam apparatus.

BRIEF DESCRIPTION OF THE DRAWINGS

Further suitable or practical embodiments and advantages of the system described herein are described below in association with the drawings. In detail:

FIG. 10 shows a schematic representation of an object with an ablated material region according to the system described herein;

FIG. 11 shows a magnified schematic representation of the object of FIG. 10 according to the system described herein;

FIG. 15 shows a schematic representation of a material region of an object according to the system described herein;

FIG. 16 shows a schematic representation of a material region of an object according to the system described herein.

DETAILED DESCRIPTION OF VARIOUS EMBODIMENTS

The system described herein is now shown using a material processing device which is embodied as a particle beam apparatus or which includes a particle beam apparatus. Particle beam apparatuses in the form of an SEM and in the form of a combination apparatus that include an electron beam column and an ion beam column are explained in more detail below. Express reference is made to the fact that the invention can be used with any particle beam apparatus, in particular in any electron beam apparatus and/or any ion beam apparatus.

Figure 1:
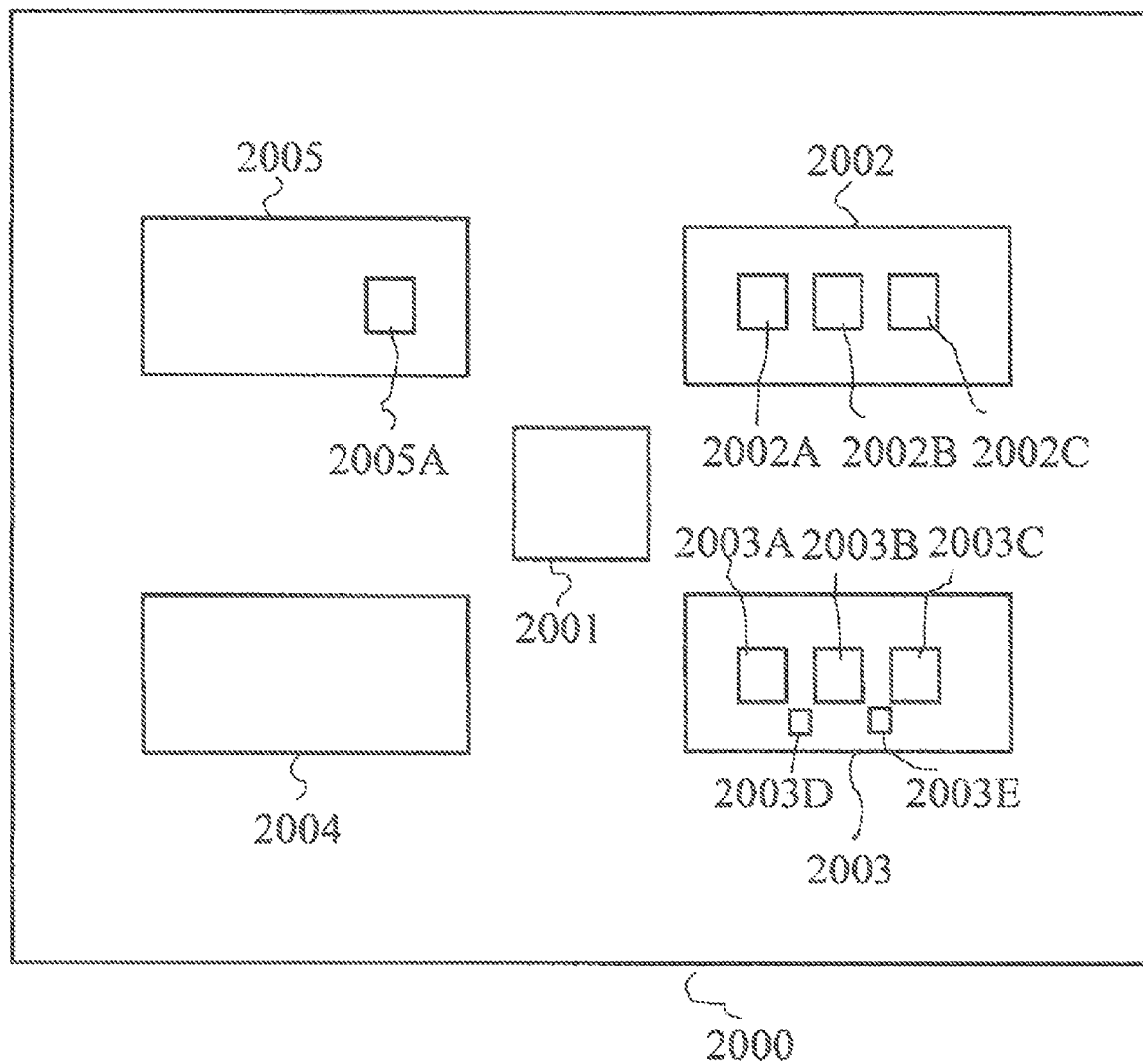
FIG. 1 shows a schematic representation of a material processing device according to the system described herein.

FIG. 1 shows a schematic representation of a material processing device 2000 according to the system described herein. The material processing device 2000 is provided for processing an object and includes a movable object holder 2001 for arranging the object. Moreover, the material processing device 2000 according to the system described herein includes a determination device 2002 that determines a region of interest of the object. By way of example, the determination device 2002 is designed such that the position or the suspected position of a region of interest is able to be entered into the determination device 2002. In addition or as an alternative thereto, the determination device 2002 includes a device for non-destructive examination of the object for the purposes of determining a region of interest. In particular, provision is made for the determination device 2002 to include an x-ray device 2002A, an ultrasound device 2002B and/or a lock-in thermography device 2002C to determine the region of interest. Expressed differently, the position of the region of interest in the object is determined using the aforementioned determination device 2002.

The material processing device 2000 according to the system described herein also includes an ablation device 2003 for ablating material. The ablation device 2003 for example includes a laser device 2003A and/or a mechanical ablation device 2003B. By way of example, the mechanical ablation device 2003B is embodied as a microtome. In addition or as an alternative thereto in turn, provision is made for the ablation device 2003 to include an ion beam device 2003C with a high-current ion beam (for example ranging from 1 nA to 10 µA, the interval limits being included in the aforementioned interval). In addition or as an alternative thereto, the ion beam device 2003C is embodied as a plasma ion beam device with a plasma beam generator. In addition or as an alternative thereto, provision is made for the ablation device 2003 to include a beam device 2003D with a beam of neutral particles. Additionally or alternatively in turn, provision is made for the ablation device 2003 to include an etching device 2003E for chemical etching.

Moreover, the material processing device 2000 according to the system described herein includes a particle beam apparatus 2004 with at least one beam generator for generating a particle beam with charged particles. The charged particles are electrons or ions, for example. Embodiments of the particle beam apparatus 2004 will be explained in greater detail below.

The material processing device 2000 according to the system described herein also includes a control device 2005 having a processor 2005A in which a computer program product is loaded, the latter, upon execution in the processor 2005A, controlling the material processing device 2000 in such a way that a method according to the system described herein is carried out. This is discussed in more detail further below.

The material processing device 2000 is embodied as for example an electron beam apparatus and/or an ion beam apparatus. In addition or as an alternative thereto, provision is made for the material processing device 2000 to be embodied as the particle beam apparatus 2004. Expressed differently, the material processing device 2000 is formed by the particle beam apparatus 2004 itself. In addition or as an alternative thereto in turn, the material processing device 2000 is designed for processing frozen, cooled, cold or vitrified objects. Expressed differently, the material processing device 2000 can be used within the scope of using cryo-technology.

Figure 2:
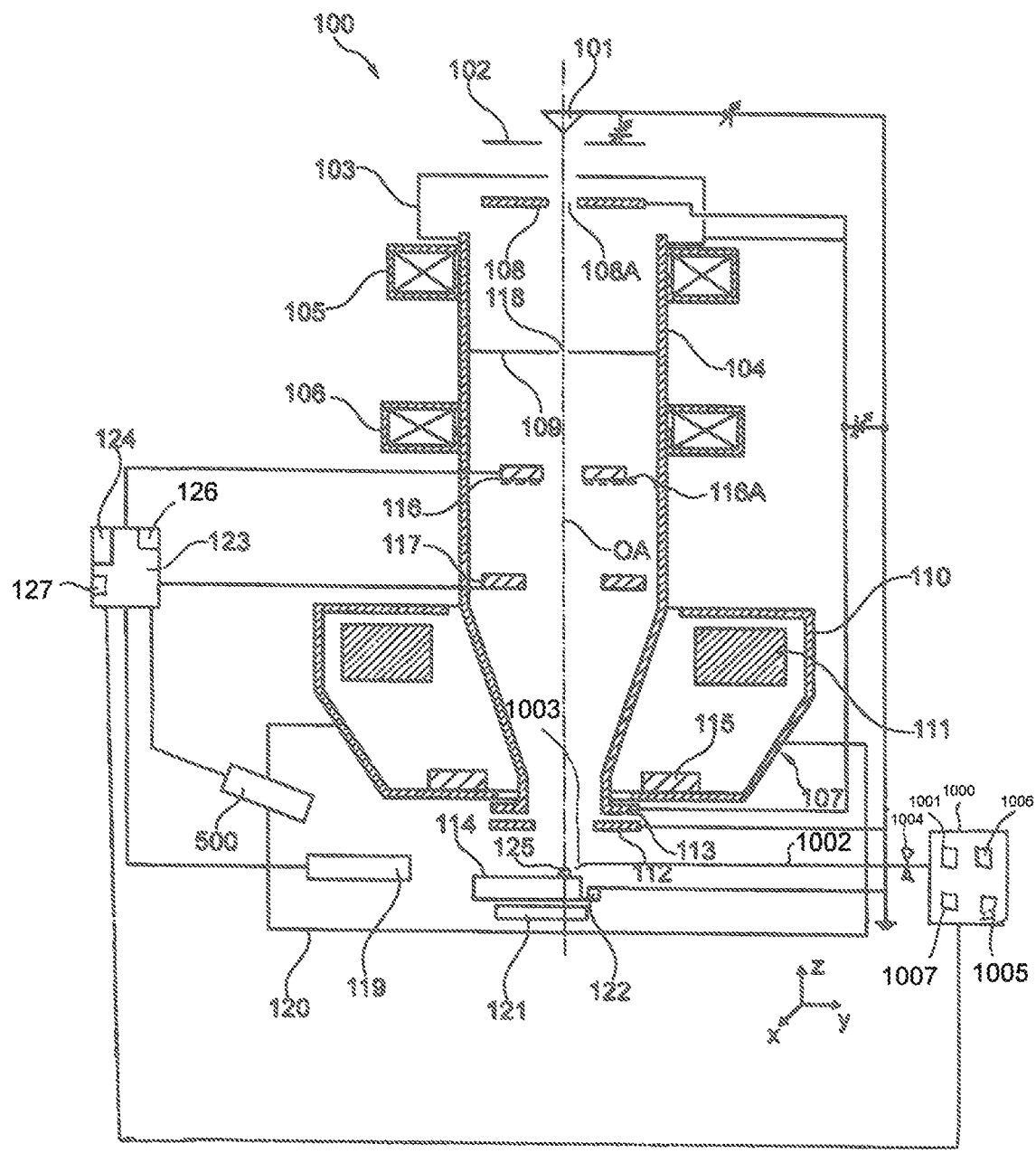
FIG. 2 shows a first embodiment of a particle beam apparatus according to the system described herein.

FIG. 2 shows a schematic representation of the particle beam apparatus 2004 in the form of an SEM 100. The SEM 100 includes a first beam generator in the form of an electron source 101, which is embodied as a cathode. Further, the SEM 100 is provided with an extraction electrode 102 and with an anode 103, which is placed onto one end of a beam guiding tube 104 of the SEM 100. By way of example, the electron source 101 is embodied as a thermal field emitter. However, the invention is not restricted to such an electron source 101. Rather, any electron source is utilizable.

Electrons emerging from the electron source 101 form a primary electron beam. The electrons are accelerated to the anode potential on account of a potential difference between the electron source 101 and the anode 103. In the embodiment depicted in FIG. 2, the anode potential is 100 V to 35 kV, e.g., 5 kV to 15 kV, in particular 8 kV, relative to a ground potential of a housing of a sample chamber 120. However, alternatively the anode potential could also be at ground potential.

Two condenser lenses, specifically a first condenser lens 105 and a second condenser lens 106, are arranged at the beam guiding tube 104. In FIG. 2, proceeding from the electron source 101 as viewed in the direction of a first objective lens 107, the first condenser lens 105 is arranged first, followed by the second condenser lens 106. It is expressly pointed out that further embodiments of the SEM 100 may include only a single condenser lens. A first aperture unit 108 is arranged between the anode 103 and the first condenser lens 105. Together with the anode 103 and the beam guiding tube 104, the first aperture unit 108 is at a high voltage potential, specifically the potential of the anode 103, or connected to ground. The first aperture unit 108 has numerous first apertures 108A, of which one is depicted in FIG. 2. By way of example, two first apertures 108A are present. Each one of the numerous first apertures 108A has a different aperture diameter. An adjustment mechanism (not depicted) may be used to set a desired first aperture 108A onto an optical axis OA of the SEM 100. Reference is explicitly made to the fact that, in further embodiments, the first aperture unit 108 may be provided with only a single aperture 108A. In the embodiment shown in FIG. 2, an adjustment mechanism may be absent. The first aperture unit 108 is then designed to be stationary. A stationary second aperture unit 109 is arranged between the first condenser lens 105 and the second condenser lens 106. As an alternative thereto, provision is made for the second aperture unit 109 to be embodied in a movable fashion.

The first objective lens 107 includes pole pieces 110, in which a hole is formed. The beam guiding tube 104 is guided through the hole. A coil 111 is arranged in the pole pieces 110.

An electrostatic retardation device is arranged in a lower region of the beam guiding tube 104. The electrostatic retardation device includes an individual electrode 112 and a tube electrode 113. The tube electrode 113 is arranged at one end of the beam guiding tube 104, the end facing an object 125 that is arranged at an object holder 114 embodied in a movable fashion. By way of example, the object holder 114 is the object holder 2001 of the material processing device 2000.

Together with the beam guiding tube 104, the tube electrode 113 is at the potential of the anode 103, while the individual electrode 112 and the object 125 are at a lower potential in relation to the potential of the anode 103. In the present case, the lower potential is the ground potential of the housing of the sample chamber 120. In this manner, the electrons of the primary electron beam can be decelerated to a desired energy which is required for examining the object 125.

The SEM 100 further includes a scanning device 115 that deflects the primary electron beam and scans over the object 125. Here, the electrons of the primary electron beam interact with the object 125. As a consequence of the interaction, interaction particles and/or interaction radiation arises/arise, which is/are detected. In particular, electrons are emitted from the surface of the object 125 or from regions of the object 125 close to the surface—so-called secondary electrons—or electrons of the primary electron beam are backscattered—so-called backscattered electrons—as interaction particles.

The object 125 and the individual electrode 112 can also be at different potentials and at potentials different from ground. It is thereby possible to set the location of the retardation of the primary electron beam in relation to the object 125. By way of example, if the retardation is carried out quite close to the object 125, imaging aberrations become smaller.

A detector arrangement that includes a first detector 116 and a second detector 117 is arranged in the beam guiding tube 104 to detect the secondary electrons and/or the backscattered electrons. Here, the first detector 116 is arranged on the source side along the optical axis OA, while the second detector 117 is arranged on the object side along the optical axis OA in the beam guiding tube 104. The first detector 116 and the second detector 117 are arranged offset from one another in the direction of the optical axis OA of the SEM 100. Both the first detector 116 and the second detector 117 have a respective passage opening, through which the primary electron beam can pass. The first detector 116 and the second detector 117 are approximately at the potential of the anode 103 and of the beam guiding tube 104. The optical axis OA of the SEM 100 extends through the respective passage openings.

The second detector 117 serves principally for detecting secondary electrons. Upon emerging from the object 125, the secondary electrons initially have a low kinetic energy and random directions of motion. A strong extraction field emanating from the tube electrode 113 accelerates the secondary electrons in the direction of the first objective lens 107. The secondary electrons enter the first objective lens 107 approximately parallel. The beam diameter of the beam of the secondary electrons remains small in the first objective lens 107 as well. The first objective lens 107 then has a strong effect on the secondary electrons and generates a comparatively short focus of the secondary electrons with sufficiently steep angles with respect to the optical axis OA, such that the secondary electrons diverge far apart from one another downstream of the focus and strike the second detector 117 on the active area thereof. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 can additionally be embodied with an opposing field grid 116A. The opposing field grid 116A is arranged at the side of the first detector 116 directed toward the object 125. With respect to the potential of the beam guiding tube 104, the opposing field grid 116A has a negative potential such that only backscattered electrons with a high energy pass through the opposing field grid 116A to the first detector 116. In addition or as an alternative thereto, the second detector 117 includes a further opposing field grid, which has an analogous embodiment to the aforementioned opposing field grid 116A of the first detector 116 and which has an analogous function.

Further, the SEM 100 includes, in the sample chamber 120, a chamber detector 119, for example an Everhart-Thornley detector or an ion detector, which has a detection surface that is coated with metal and blocks light.

The detection signals generated by the first detector 116, the second detector 117 and the chamber detector 119 are used to generate an image or images of the surface of the object 125.

It is expressly pointed out that the apertures of the first aperture unit 108 and of the second aperture unit 109, as well as the passage openings of the first detector 116 and of the second detector 117, are depicted in exaggerated fashion. The passage openings of the first detector 116 and of the second detector 117 have an extent perpendicular to the optical axis OA in the range of 0.5 mm to 5 mm. By way of example, the passage openings are of circular design and have a diameter in the range of 1 mm to 3 mm perpendicular to the optical axis OA.

The second aperture unit 109 is configured as a pinhole aperture unit in the embodiment depicted in FIG. 2 and is provided with a second aperture 118 for the passage of the primary electron beam, which has an extent in the range from 5 μm to 500 μm, e.g., 35 μm. As an alternative thereto, provision is made in a further embodiment for the second aperture unit 109 to be provided with a plurality of apertures, which can be displaced mechanically with respect to the primary electron beam or which can be reached by the primary electron beam by the use of electrical and/or magnetic deflection elements. The second aperture unit 109 is embodied as a pressure stage aperture unit, which separates a first region, in which the electron source 101 is arranged and in which there is an ultra-high vacuum ($10^{-7}$ hPa to $10^{-12}$ hPa), from a second region, which has a high vacuum ($10^{-3}$ hPa to $10^{-7}$ hPa). The second region is the intermediate pressure region of the beam guiding tube 104, which leads to the sample chamber 120.

The sample chamber 120 is under vacuum. For the purposes of producing the vacuum, a pump (not depicted) is arranged at the sample chamber 120. In the embodiment depicted in FIG. 2, the sample chamber 120 is operated in a first pressure range or in a second pressure range. The first pressure range includes only pressures of less than or equal to $10^{-3}$ hPa, and the second pressure range includes only pressures of greater than $10^{-3}$ hPa. To ensure said pressure ranges, the sample chamber 120 is vacuum-sealed.

The object holder 114 is arranged at a sample stage 122. The sample stage 122 has movement units such that the object holder 114 is embodied to be movable in three directions arranged perpendicular to one another, specifically in an x-direction (first stage axis), in a y-direction (second stage axis) and in a z-direction (third stage axis). Moreover, the sample stage 122 has movement units such that the object holder 114 can be rotated about two axes of rotation (stage axes of rotation) arranged perpendicular to one another. The invention is not restricted to the sample stage 122 described above. Rather, the sample stage 122 can have further translation axes and axes of rotation along which or about which the object holder 114 can move.

The SEM 100 further includes a third detector 121, which is arranged in the sample chamber 120. More precisely, the third detector 121 is arranged downstream of the sample stage 122, viewed from the electron source 101 along the optical axis OA. The sample stage 122, and hence the object holder 114, can be rotated in such a way that the primary electron beam can radiate through the object 125 arranged on the object holder 114. When the primary electron beam passes through the object 125 to be examined, the electrons of the primary electron beam interact with the material of the object 125 to be examined. The electrons passing through the object 125 to be examined are detected by the third detector 121.

Arranged at the sample chamber 120 is a radiation detector 500, which is used to detect interaction radiation, for example x-ray radiation and/or cathodoluminescent light. The radiation detector 500, the first detector 116, the second detector 117, and the chamber detector 119 are connected to a control unit 123, which includes a monitor 124. The third detector 121 is also connected to the control unit 123, which is not depicted in FIG. 2 for reasons of clarity. The control unit 123 processes detection signals that are generated by the first detector 116, the second detector 117, the chamber detector 119, the third detector 121 and/or the radiation detector 500 and displays the detection signals in the form of images or spectra on the monitor 124.

The control unit 123 furthermore has a database 126, in which data are stored and from which data are read out. By way of example, the control unit 123 is embodied as the control device 2005 of the material processing device 2000. The control unit 123 includes a processor 127, which for example is embodied as the processor 2005A and/or in which a computer program product with a program code is loaded which, upon execution, controls the material processing device 2000 and/or the SEM 100 in such a way that the method according to the system described herein is carried out. This is discussed in more detail below.

The SEM 100 includes a gas feed device 1000, which serves to feed a gaseous precursor to a specific position on the surface of the object 125. The gas feed device 1000 includes a gas reservoir in the form of a precursor reservoir 1001. By way of example, the precursor is received as a solid, gaseous or liquid substance in the precursor reservoir 1001. By heating and/or cooling the precursor, the equilibrium between the solid phase, the liquid phase and the gaseous phase is adjusted in such a way that the required vapor pressure is available. By way of example, phenanthrene is used as precursor. Essentially a layer of carbon or a carbon-containing layer then deposits on the surface of the object 125. As an alternative thereto, by way of example, a precursor having metal can be used to deposit a metal or a metal-containing layer on the surface of the object 125. However, the depositions are not limited to carbon and/or metals. Rather, arbitrary substances can be deposited on the surface of the object 125, for example semiconductors, non-conductors or other compounds. Furthermore, provision is also made for the precursor to be used for ablating material of the object 125 upon interaction with the particle beam.

The gas feed device 1000 is provided with a feed line 1002. The feed line 1002 has, in the direction of the object 125, an acicular hollow tube 1003, which is able to be brought into the vicinity of the surface of the object 125 for example at a distance of 10 μm to 1 mm from the surface of the object 125. The hollow tube 1003 has a feed opening, the diameter of which is for example in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125. When the valve 1004 is closed, the flow of the gaseous precursor onto the surface of the object 125 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 using a rotation and/or a tilting. The gas feed device 1000 and thus also the adjusting unit 1005 are connected to the control unit 123 of the SEM 100.

In further embodiments, the precursor reservoir 1001 is not arranged directly at the gas feed device 1000. Rather, in the further embodiments, provision is made for the precursor reservoir 1001 to be arranged for example at a wall of a space in which the SEM 100 is situated.

The gas feed device 1000 includes a temperature measuring unit 1006. By way of example, an infrared measuring apparatus or a semiconductor temperature sensor is used as temperature measuring unit 1006. However, the invention is not restricted to the use of such temperature measuring units. Rather, any suitable temperature measuring unit which is suitable for the invention can be used as temperature measuring unit. In particular, provision can be made for the temperature measuring unit 1006 not to be arranged at the gas feed device 1000 itself, but rather to be arranged for example at a distance from the gas feed device 1000.

The gas feed device 1000 also includes a temperature setting unit 1007. By way of example, the temperature setting unit 1007 is a heating device, in particular a conventional infrared heating device. As an alternative thereto, the temperature setting unit 1007 is embodied as a heating and/or cooling device, which includes a heating wire and/or a Peltier element, for example. However, the invention is not restricted to the use of such a temperature setting unit 1007. Rather, any suitable temperature setting unit can be used for the invention.

Figure 3:
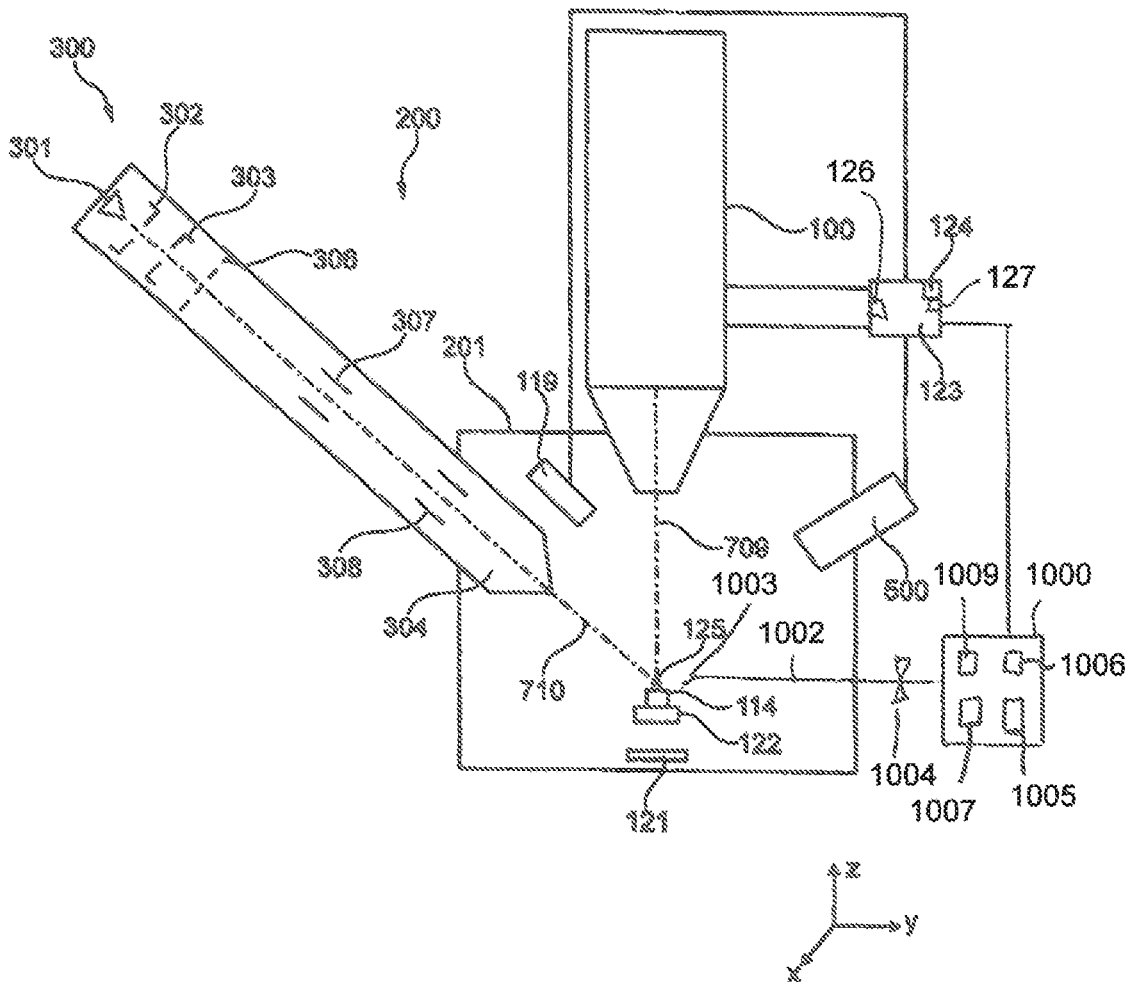
FIG. 3 shows a second embodiment of a particle beam apparatus according to the system described herein.

FIG. 3 shows a schematic representation of the particle beam apparatus 2004 in the form of a combination apparatus 200. The combination apparatus 200 includes two particle beam columns. Firstly, the combination apparatus 200 is provided with the SEM 100, as already depicted in FIG. 2, but without the sample chamber 120. Rather, the SEM 100 is arranged at a sample chamber 201. The sample chamber 201 is under vacuum. For the purposes of producing the vacuum, a pump (not depicted) is arranged at the sample chamber 201. In the embodiment depicted in FIG. 3, the sample chamber 201 is operated in a first pressure range or in a second pressure range. The first pressure range includes only pressures of less than or equal to $10^{-3}$ hPa, and the second pressure range includes only pressures of greater than $10^{-3}$ hPa. To ensure maintaining the pressure ranges, the sample chamber 201 is vacuum-sealed.

Arranged in the sample chamber 201 is the chamber detector 119 which is embodied, for example, in the form of an Everhart-Thornley detector or an ion detector and which has a detection surface coated with metal that blocks light. Further, the third detector 121 is arranged in the sample chamber 201.

The SEM 100 serves to generate a first particle beam, specifically the primary electron beam described above, and has the optical axis, specified above, which is provided with the reference sign 709 in FIG. 3 and which is also referred to as first beam axis below. Secondly, the combination apparatus 200 is provided with an ion beam apparatus 300, which is likewise arranged at the sample chamber 201. The ion beam apparatus 300 likewise has an optical axis, which is provided with the reference sign 710 in FIG. 3 and which is also referred to as second beam axis below.

The SEM 100 is arranged vertically in relation to the sample chamber 201. By contrast, the ion beam apparatus 300 is arranged in a manner inclined by an angle of approximately 0° to 90° in relation to the SEM 100. An arrangement of approximately 50° is depicted by way of example in FIG. 3. The ion beam apparatus 300 includes a second beam generator in the form of an ion beam generator 301. Ions, which form a second particle beam in the form of an ion beam, are generated by the ion beam generator 301. The ions are accelerated using an extraction electrode 302, which is at a predefinable potential. The second particle beam then passes through an ion optical unit of the ion beam apparatus 300, where the ion optical unit includes a condenser lens 303 and a second objective lens 304. The second objective lens 304 ultimately generates an ion probe, which is focused onto the object 125 being arranged at an object holder 114. The object holder 114 is arranged at a sample stage 122. By way of example, the object holder 114 is embodied as the object holder 2001 of the material processing device 2000.

An adjustable or selectable aperture unit 306, a first electrode arrangement 307 and a second electrode arrangement 308 are arranged above the second objective lens 304 (i.e., in the direction of the ion beam generator 301), where the first electrode arrangement 307 and the second electrode arrangement 308 are embodied as scanning electrodes. The second particle beam is scanned over the surface of the object 125 using the first electrode arrangement 307 and the second electrode arrangement 308, with the first electrode arrangement 307 acting in a first direction and the second electrode arrangement 308 acting in a second direction, which is counter to the first direction. Thus, scanning is carried out in an x-direction, for example. The scanning in a y-direction perpendicular thereto is brought about by further electrodes (not depicted), which are rotated by 90°, at the first electrode arrangement 307 and at the second electrode arrangement 308.

As explained above, the object holder 114 is arranged at the sample stage 122. In the embodiment shown in FIG. 3, too, the sample stage 122 has movement units such that the object holder 114 is embodied to be movable in three directions arranged perpendicular to one another, specifically in an x-direction (first stage axis), in a y-direction (second stage axis) and in a z-direction (third stage axis). Moreover, the sample stage 122 has movement units such that the object holder 114 can be rotated about two axes of rotation (stage axes of rotation) arranged perpendicular to one another.

The distances depicted in FIG. 3 between the individual units of the combination apparatus 200 are depicted in exaggerated fashion in order to better illustrate the individual units of the combination apparatus 200.

Arranged at the sample chamber 201 is a radiation detector 500, which is used to detect interaction radiation, for example x-ray radiation and/or cathodoluminescent light. The radiation detector 500 is connected to a control unit 123, which includes a monitor 124. By way of example, the control unit 123 is embodied as the control unit 2005 of the material processing device 2000.

The control unit 123 processes detection signals that are generated by the first detector 116, the second detector 117 (not depicted in FIG. 3), the chamber detector 119, the third detector 121 and/or the radiation detector 500 and displays the detection signals in the form of images or spectra on the monitor 124.

The control unit 123 furthermore has a database 126, in which data are stored and from which data are read out. Moreover, the control unit 123 includes a processor 127, which for example is embodied as the processor 2005A and/or in which a computer program product with a program code is loaded which, upon execution, controls the material processing device 2000 and/or the combination apparatus 200 in such a way that the method according to the system described herein is carried out. This is discussed in more detail further below.

The combination apparatus 200 includes a gas feed device 1000, which serves to feed a gaseous precursor to a specific position on the surface of the object 125. The gas feed device 1000 includes a gas reservoir in the form of a precursor reservoir 1001. By way of example, the precursor is received as a solid, gaseous or liquid substance in the precursor reservoir 1001. By heating and/or cooling the precursor, the equilibrium between the solid phase, the liquid phase and the gaseous phase is adjusted in such a way that the required vapor pressure is available.

By way of example, phenanthrene is used as precursor. Essentially a layer of carbon or a carbon-containing layer then deposits on the surface of the object 125. As an alternative thereto, by way of example, a precursor having metal can be used to deposit a metal or a metal-containing layer on the surface of the object 125. However, the depositions are not limited to carbon and/or metals. Rather, arbitrary substances can be deposited on the surface of the object 125, for example semiconductors, non-conductors or other compounds. Furthermore, provision is also made for the precursor to be used for ablating material of the object 125 upon interaction with one of the two particle beams.

The gas feed device 1000 is provided with a feed line 1002. The feed line 1002 has, in the direction of the object 125, an acicular hollow tube 1003, which is able to be brought into the vicinity of the surface of the object 125 for example at a distance of 10 μm to 1 mm from the surface of the object 125. The hollow tube 1003 has a feed opening, the diameter of which is for example in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125. When the valve 1004 is closed, the flow of the gaseous precursor onto the surface of the object 125 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 using a rotation and/or a tilting. The gas feed device 1000 and thus also the adjusting unit 1005 are connected to the control unit 123 of the combination apparatus 200.

In further embodiments, the precursor reservoir 1001 is not arranged directly at the gas feed device 1000. Rather, in the further embodiments, provision is made for the precursor reservoir 1001 to be arranged for example at a wall of a space in which the combination apparatus 200 is situated.

The gas feed device 1000 includes a temperature measuring unit 1006. By way of example, an infrared measuring apparatus or a semiconductor temperature sensor is used as temperature measuring unit 1006. However, the invention is not restricted to the use of such temperature measuring units. Rather, any suitable temperature measuring unit which is suitable for the invention can be used as temperature measuring unit. In particular, provision can be made for the temperature measuring unit 1006 not to be arranged at the gas feed device 1000 itself, but rather to be arranged for example at a distance from the gas feed device 1000.

The gas feed device 1000 also includes a temperature setting unit 1007. By way of example, the temperature setting unit 1007 is a heating device, in particular a conventional infrared heating device. As an alternative thereto, the temperature setting unit 1007 is in the form of a heating and/or cooling device, which includes a heating wire and/or a Peltier element, for example. However, the invention is not restricted to the use of such a temperature setting unit 1007. Rather, any suitable temperature setting unit can be used for the invention.

Figure 4:
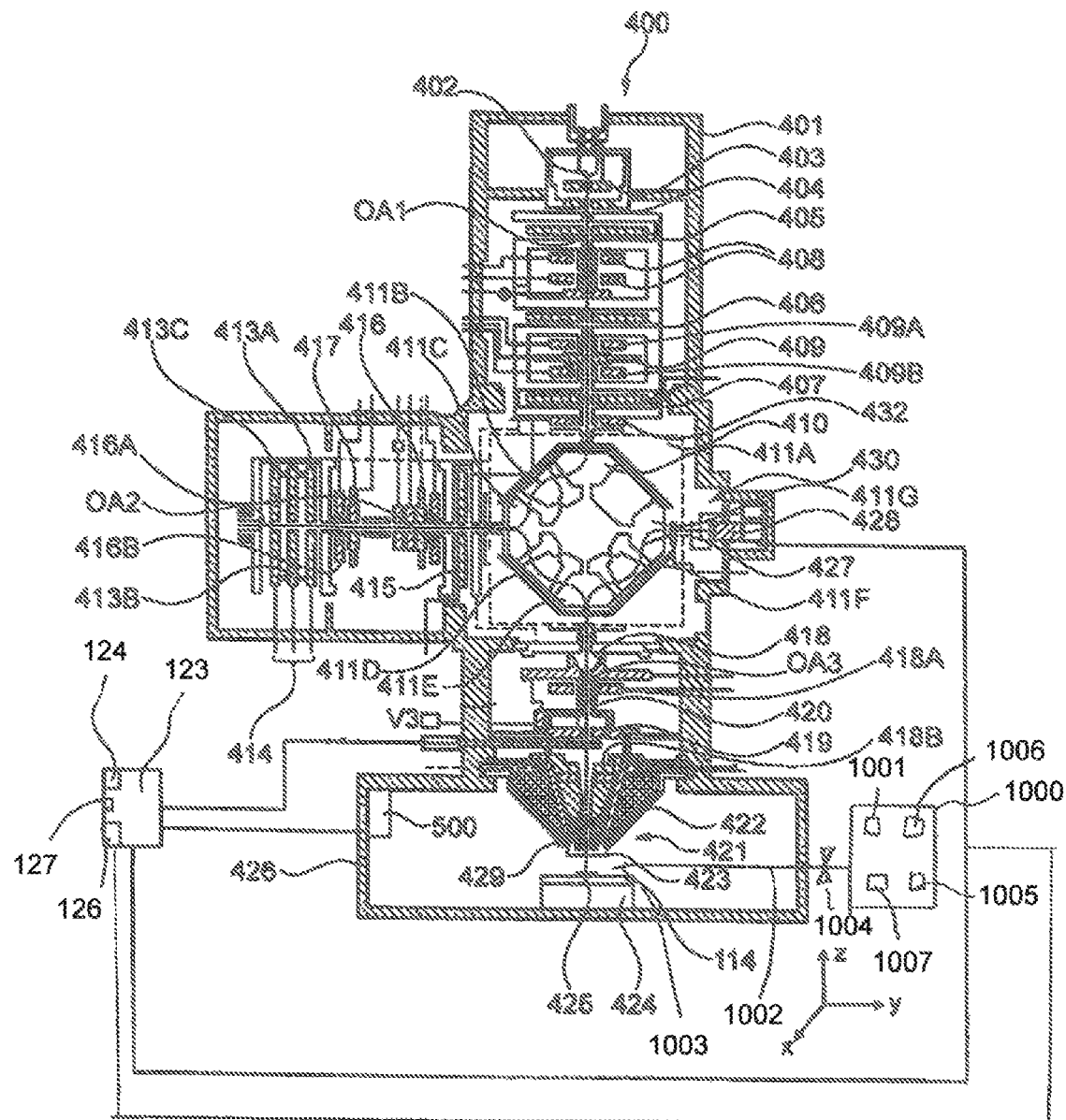
FIG. 4 shows a third embodiment of a particle beam apparatus according to the system described herein.

FIG. 4 shows a schematic representation of the particle beam apparatus 2004 in the form of a further particle beam apparatus. The embodiment of FIG. 4 of the particle beam apparatus is provided with the reference sign 400 and includes a mirror corrector for correcting, e.g., chromatic and/or spherical aberration. The particle beam apparatus 400 includes a particle beam column 401, which is embodied as an electron beam column and which substantially corresponds to an electron beam column of a corrected SEM.

However, the particle beam apparatus 400 is not restricted to an SEM with a mirror corrector. Rather, the particle beam apparatus 400 may include any type of corrector units.

The particle beam column 401 includes a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 on account of a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is set along the beam path using a beam guiding device. The beam guiding device of the embodiment shown in FIG. 4 includes a source setting unit with two magnetic deflection units 408 arranged along the first optical axis OA1. Moreover, the particle beam apparatus 400 includes electrostatic beam deflection units. A first electrostatic beam deflection unit 409, which is also embodied as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are set for the purposes of setting the particle beam in respect of the axis of the third electrostatic lens 407 and the entrance window of a beam deflection device 410. The first electrostatic beam deflection unit 409, the first multi-pole unit 409A and the second multi-pole unit 409B can interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 includes a plurality of magnetic sectors, specifically a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and the particle beam is deflected by the beam deflection device 410 in the direction of a second optical axis OA2. The beam deflection is performed using the first magnetic sector 411A, using the second magnetic sector 411B, and using the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 4, the deflection with respect to the second optical axis OA2 and with respect to the third optical axis OA3 is provided by deflection of the particle beam at an angle of 90°. Hence, the third optical axis OA3 extends coaxially with respect to the first optical axis OA1. However, it is pointed out that the particle beam apparatus 400 according to the system described here is not restricted to deflection angles of 90°. Rather, any suitable deflection angle can be selected by the beam deflection device 410, for example 70° or 110°, such that the first optical axis OA1 does not extend coaxially with respect to the third optical axis OA3. In respect of further details of the beam deflection device 410, reference is made to WO 02/067286 A2.

After the particle beam has been deflected by the first magnetic sector 411A, the second magnetic sector 411B, and the third magnetic sector 411C, the particle beam is guided along the second optical axis OA2. The particle beam is guided to an electrostatic mirror 414 and travels on a path of the particle beam to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 includes a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, the electrons are deflected to the third optical axis OA3 by the third magnetic sector 411C, the fourth magnetic sector 411D, and the fifth magnetic sector 411E.

The electrons of the particle beam emerge from the beam deflection device 410 and the electrons are guided along the third optical axis OA3 to an object 425 that is intended to be examined and is arranged in an object holder 114. By way of example, the object holder 114 is embodied as the object holder 2001 of the material processing device 2000.

On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam guiding tube 420.

The objective lens 421 focuses the particle beam into a focal plane in which the object 425 is arranged. The object holder 114 is arranged at a movable sample stage 424. The movable sample stage 424 is arranged in a sample chamber 426 of the particle beam apparatus 400. The sample stage 424 has movement units such that the object holder 114 is embodied to be movable in three directions arranged perpendicular to one another, specifically in an x-direction (first stage axis), in a y-direction (second stage axis) and in a z-direction (third stage axis). Moreover, the sample stage 424 has movement units such that the object holder 114 can be rotated about two axes of rotation (stage axes of rotation) arranged perpendicular to one another.

The sample chamber 426 is under vacuum. For the purposes of producing the vacuum, a pump (not depicted) is arranged at the sample chamber 426. In the embodiment depicted in FIG. 4, the sample chamber 426 is operated in a first pressure range or in a second pressure range. The first pressure range includes only pressures of less than or equal to $10^{-3}$ hPa, and the second pressure range includes only pressures of greater than $10^{-3}$ hPa. To ensure achieving the pressure ranges, the sample chamber 426 is vacuum-sealed.

The objective lens 421 can be embodied as a combination of a magnetic lens 422 and a sixth electrostatic lens 423. The end of the beam guiding tube 420 can furthermore be an electrode of an electrostatic lens. After emerging from the beam guiding tube 420, particles of the particle beam apparatus are decelerated to a potential of the object 425. The objective lens 421 is not restricted to a combination of the magnetic lens 422 and the sixth electrostatic lens 423. Rather, the objective lens 421 may assume any suitable embodiment. By way of example, the objective lens 421 can also be embodied as a purely magnetic lens or as a purely electrostatic lens.

The particle beam which is focused onto the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 includes a first analysis detector 419, which is arranged between the beam deflection device 410 and the objective lens 421 along the beam path. Secondary electrons traveling in directions oriented at a large angle with respect to the third optical axis OA3 are detected by the first analysis detector 419. Backscattered electrons and secondary electrons which have a small axial distance with respect to the third optical axis OA3 at the location of the first analysis detector 419—i.e., backscattered electrons and secondary electrons which have a small distance from the third optical axis OA3 at the location of the first analysis detector 419—enter the beam deflection device 410 and are deflected to a second analysis detector 428 by the fifth magnetic sector 411E, the sixth magnetic sector 411F and the seventh magnetic sector 411G along a detection beam path 427. By way of example, the deflection angle is 90° or 110°.

The first analysis detector 419 generates detection signals which are largely generated by emitted secondary electrons. The detection signals which are generated by the first analysis detector 419 are guided to a control unit 123 and are used to obtain information about the properties of the interaction region of the focused particle beam with the object 425. In particular, the focused particle beam is scanned over the object 425 using a scanning device 429. Using the detection signals generated by the first analysis detector 419, an image of the scanned region of the object 425 can then be generated and displayed on a display unit. The display unit is, for example, a monitor 124 that is arranged at the control unit 123. By way of example, the control unit 123 is embodied as the control unit 2005 of the material processing device 2000.

The second analysis detector 428 is also connected to the control unit 123. Detection signals of the second analysis detector 428 are passed to the control unit 123 and used to generate an image of the scanned region of the object 425 and to display the image on a display unit. The display unit is for example the monitor 124 that is arranged at the control unit 123.

Arranged at the sample chamber 426 is a radiation detector 500, which is used to detect interaction radiation, for example x-ray radiation and/or cathodoluminescent light. The radiation detector 500 is connected to the control unit 123, which includes the monitor 124. The control unit 123 processes detection signals of the radiation detector 500 and displays the detection signals in the form of images and/or spectra on the monitor 124.

The control unit 123 furthermore has a database 126, in which data are stored and from which data are read out. Moreover, the control unit 123 includes a processor 127, which for example is embodied as the processor 2005A and/or in which a computer program product with a program code is loaded which, upon execution, controls the material processing device 2000 and/or the particle beam apparatus 400 in such a way that the method according to the system described herein is carried out. This is discussed in more detail further below.

The particle beam apparatus 400 includes a gas feed device 1000, which serves to feed a gaseous precursor to a specific position on the surface of the object 425. The gas feed device 1000 includes a gas reservoir in the form of a precursor reservoir 1001. By way of example, the precursor is received as a solid, gaseous or liquid substance in the precursor reservoir 1001. By heating and/or cooling the precursor, the equilibrium between the solid phase, the liquid phase and the gaseous phase is adjusted in such a way that the required vapor pressure is available.

By way of example, phenanthrene is used as precursor. Essentially a layer of carbon or a carbon-containing layer then deposits on the surface of the object 425. As an alternative thereto, by way of example, a precursor having metal can be used to deposit a metal or a metal-containing layer on the surface of the object 425. However, the depositions are not limited to carbon and/or metals. Rather, arbitrary substances can be deposited on the surface of the object 425, for example semiconductors, non-conductors or other compounds. Furthermore, provision is also made for the precursor to be used for ablating material of the object 425 upon interaction with a particle beam.

The gas feed device 1000 is provided with a feed line 1002. The feed line 1002 has, in the direction of the object 425, an acicular hollow tube 1003, which is able to be brought into the vicinity of the surface of the object 425 for example at a distance of 10 μm to 1 mm from the surface of the object 425. The hollow tube 1003 has a feed opening, the diameter of which is for example in the range of 10 μm to 1000 μm, in particular in the range of 100 μm to 600 μm. The feed line 1002 has a valve 1004 in order to regulate the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 425. When the valve 1004 is closed, the flow of the gaseous precursor onto the surface of the object 425 is stopped.

The gas feed device 1000 is furthermore provided with an adjusting unit 1005, which enables an adjustment of the position of the hollow tube 1003 in all 3 spatial directions—namely an x-direction, a y-direction and a z-direction—and an adjustment of the orientation of the hollow tube 1003 using a rotation and/or a tilting. The gas feed device 1000 and thus also the adjusting unit 1005 are connected to the control unit 123 of the particle beam apparatus 400.

In further embodiments, the precursor reservoir 1001 is not arranged directly at the gas feed device 1000. Rather, in the further embodiments, provision is made for the precursor reservoir 1001 to be arranged for example at a wall of a space in which the particle beam apparatus 400 is situated.

The gas feed device 1000 includes a temperature measuring unit 1006. By way of example, an infrared measuring apparatus or a semiconductor temperature sensor is used as temperature measuring unit 1006. However, the invention is not restricted to the use of such temperature measuring units. Rather, any suitable temperature measuring unit which is suitable for the invention can be used as temperature measuring unit. In particular, provision can be made for the temperature measuring unit 1006 not to be arranged at the gas feed device 1000 itself, but rather to be arranged for example at a distance from the gas feed device 1000.

The gas feed device 1000 further includes a temperature setting unit 1007. By way of example, the temperature setting unit 1007 is a heating device, in particular a conventional infrared heating device. As an alternative thereto, the temperature setting unit 1007 is embodied as a heating and/or cooling device, which includes a heating wire and/or a Peltier element, for example. However, the invention is not restricted to the use of such a temperature setting unit 1007. Rather, any suitable temperature setting unit can be used for the invention.

Figure 5:
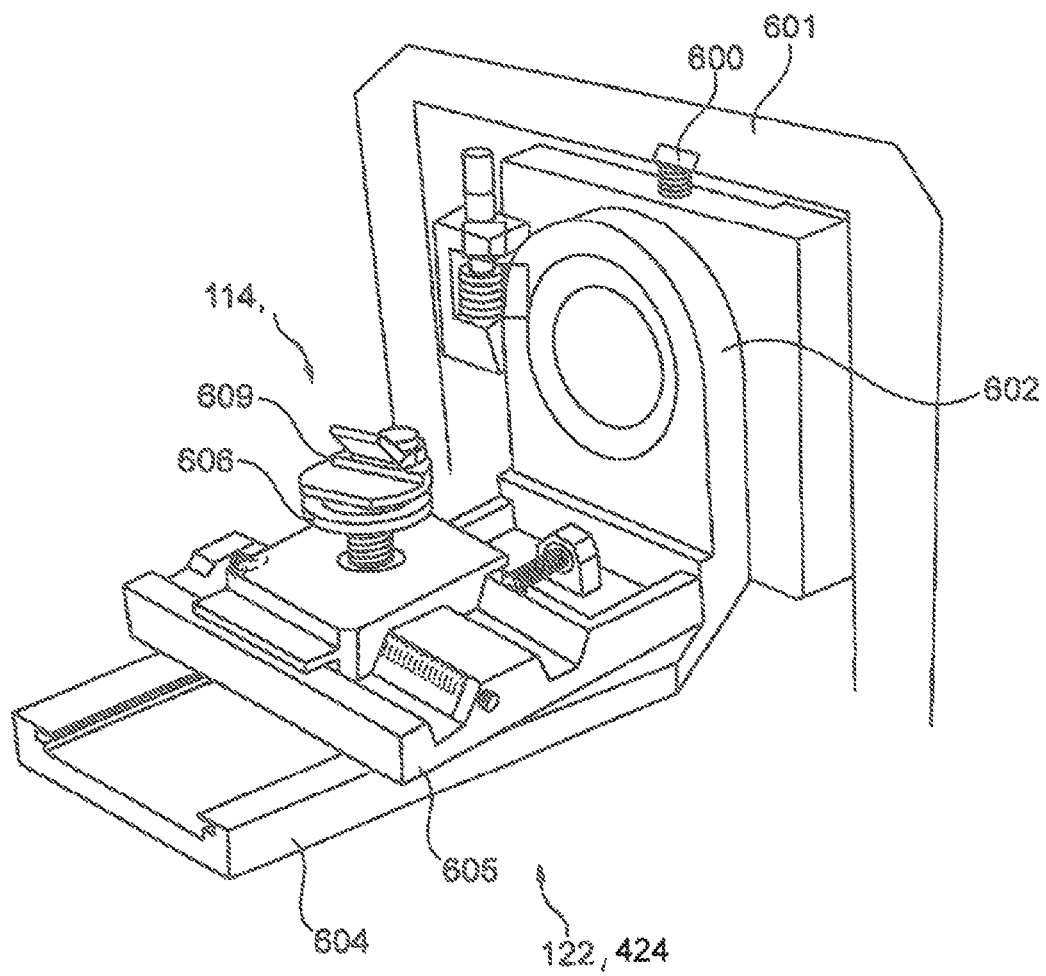
FIG. 5 shows a schematic representation of a sample stage of a particle beam apparatus according to the system described herein.

Now, the sample stage 122 of the SEM 100, the sample stage 122 of the combination apparatus 200 and the sample stage 424 of the particle beam apparatus 400 are discussed below. The sample stage 122, 424 is embodied as a sample stage with movement units, which is depicted schematically in FIGS. 5 and 6. Reference is made to the fact that the invention is not restricted to the sample stage 122, 424 described here. Rather, the invention can have any movable sample stage that is suitable for the invention.

Arranged on the sample stage 122, 424 is the object holder 114 with the object 125, 425. The sample stage 122, 424 has movement units that ensure a movement of the object holder 114 in such a way that a region of interest on the object 125, 425 can be examined and/or processed using a particle beam. The movement units are depicted schematically in FIGS. 5 and 6 and are explained below.

The sample stage 122, 424 has a first movement unit 600 on a housing 601 of the sample chamber 120, 201, 426, in which the sample stage 122, 424 is arranged. The first movement unit 600 enables a movement of the object holder 114 along the z-axis (third stage axis). Further, provision is made of a second movement unit 602. The second movement unit 602 enables a rotation of the object holder 114 about a first stage axis of rotation 603, which is also referred to as a tilt axis. This second movement unit 602 serves to tilt the object 125, 425 about the first stage axis of rotation 603.

Arranged on the second movement unit 602, in turn, is a third movement unit 604 that is embodied as a guide for a slide and that ensures that the object holder 114 is movable in the x-direction (first stage axis). The aforementioned slide is a further movement unit in turn, specifically a fourth movement unit 605. The fourth movement unit 605 is embodied in such a way that the object holder 114 is movable in the y-direction (second stage axis). To this end, the fourth movement unit 605 has a guide in which a further slide is guided, a holder 609 with the object holder 114 and the object 125, 425 in turn being arranged on the latter.

The holder 609 is embodied, in turn, with a fifth movement unit 606 that facilitates a rotation of the holder 609 about a second stage axis of rotation 607. The second stage axis of rotation 607 is oriented perpendicular to the first stage axis of rotation 603.

On account of the above-described arrangement, the sample stage 122, 424 of the embodiment discussed here has the following kinematic chain: first movement unit 600 (movement along the z-axis)—second movement unit 602 (rotation about the first stage axis of rotation 603)—third movement unit 604 (movement along the x-axis)—fourth movement unit 605 (movement along the y-axis)—fifth movement unit 606 (rotation about the second stage axis of rotation 607).

In a further embodiment (not depicted), provision is made for further movement units to be arranged at the sample stage 122, 424 such that movements along further translational axes and/or about further axes of rotation are made possible.

Figure 6:
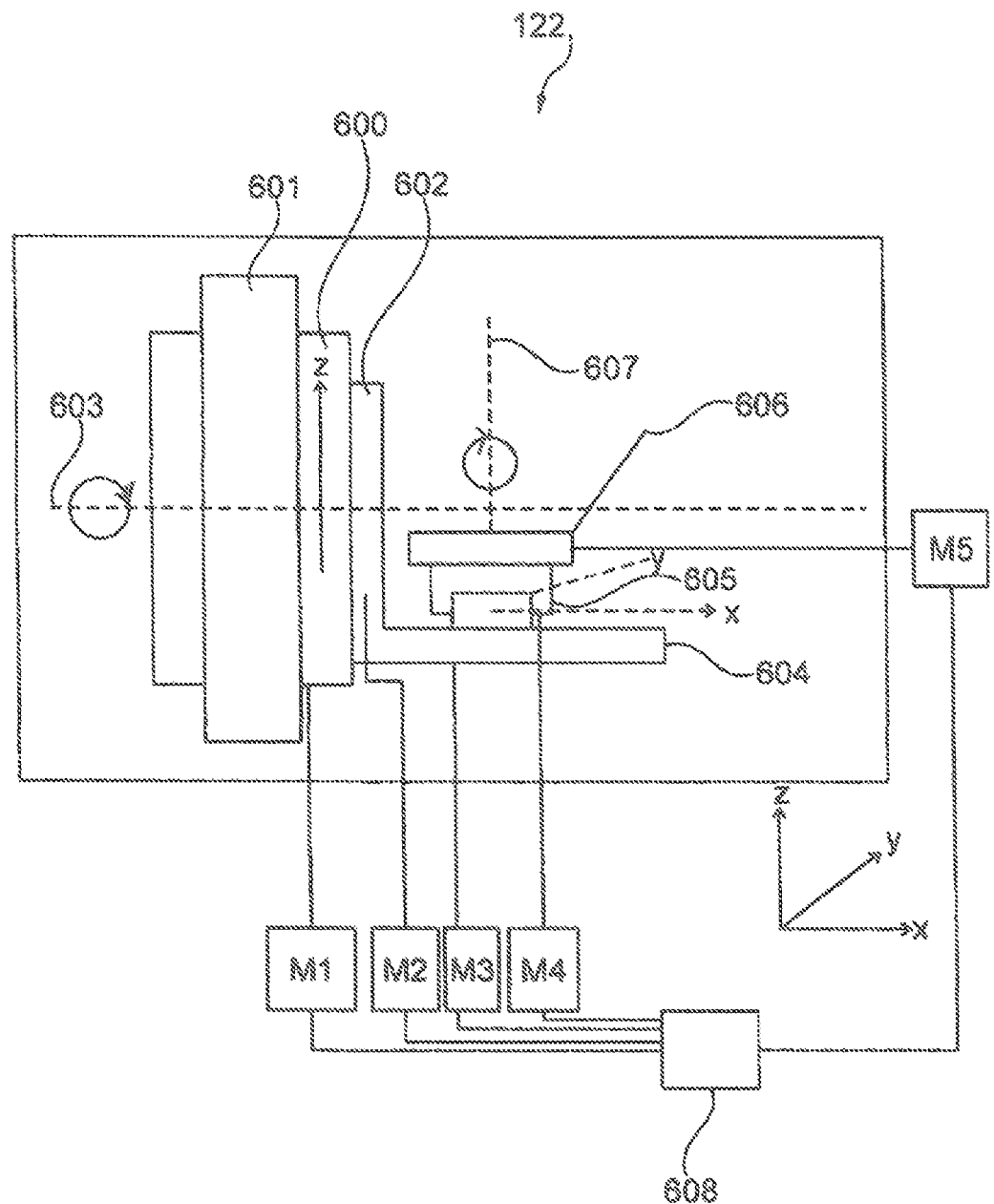
FIG. 6 shows a further schematic representation of the sample stage of FIG. 5 according to the system described herein.

It is clear from FIG. 6 that each of the aforementioned movement units is connected to a stepper motor. Thus, the first movement unit 600 is connected to a first stepper motor M1 and driven on account of a driving force that is provided by the first stepper motor M1. The second movement unit 602 is connected to a second stepper motor M2, which drives the second movement unit 602. The third movement unit 604 is connected, in turn, to a third stepper motor M3. The third stepper motor M3 provides a driving force for driving the third movement unit 604. The fourth movement unit 605 is connected to a fourth stepper motor M4, wherein the fourth stepper motor M4 drives the fourth movement unit 605. Further, the fifth movement unit 606 is connected to a fifth stepper motor M5. The fifth stepper motor M5 provides a driving force that drives the fifth movement unit 606. The aforementioned stepper motors M1 to M5 are controlled by a control unit 608 (see FIG. 6).

As already mentioned above, the SEM 100, the combination apparatus 200 and/or the particle beam apparatus 400 itself can be embodied as the material processing device 2000. In this case, the SEM 100, the combination apparatus 200 and/or the particle beam apparatus 400 has or have all features explained above or below in respect of the material processing device 2000.

Embodiments of the method according to the system described herein are explained in more detail below in relation to the material processing device 2000 in the form of the combination apparatus 200. The method according to the system described herein is carried out in analogous fashion in relation to the SEM 100 and/or the particle beam apparatus 400.

Figure 7:
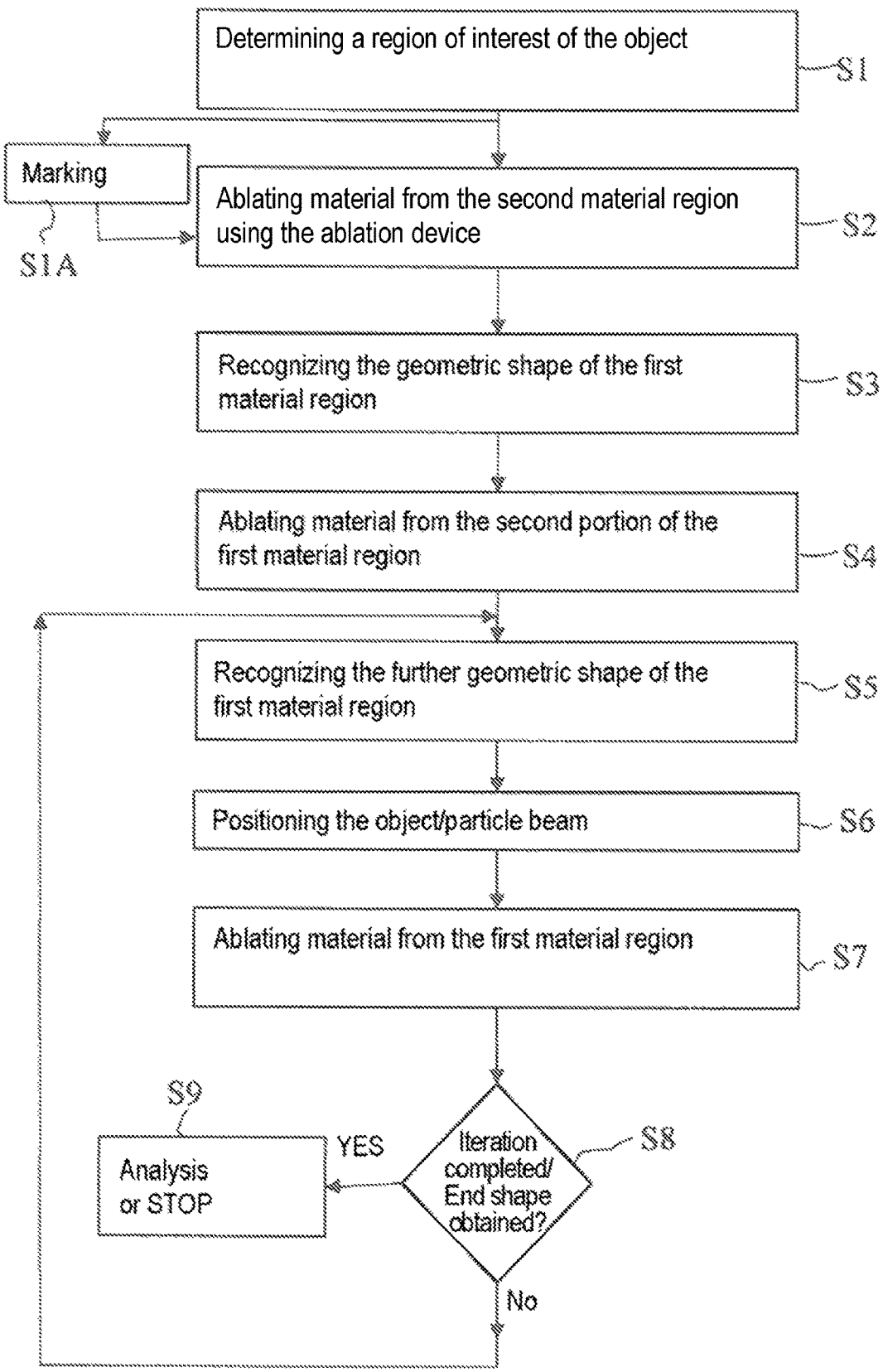
FIG. 7 shows a schematic representation of a procedure of an embodiment of a method according to the system described herein.
Figure 8:
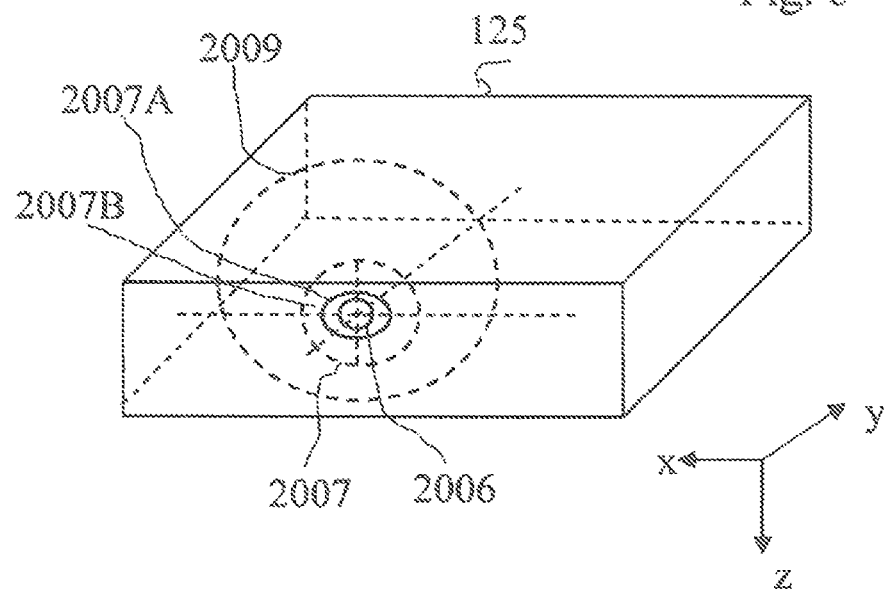
FIG. 8 shows a schematic representation of an object with a region of interest according to the system described herein.

FIG. 7 shows a schematic representation of a procedure of one embodiment of the method according to the system described herein. FIG. 8 shows a schematic representation of the object 125. In a method step S1, a region of interest 2006 of the object 125 arranged on or in a first material region 2007 of the object 125 is determined using the determination device 2002 of the material processing device 2000. Expressed differently, the position of the region of interest 2006 is determined in or on the object 125. By way of example, the region of interest 2006 is a precipitate in the material of the object 125, a pore in the material of the object 125, an impurity phase in the material of the object 125, an interface in the material of the object 125 or a defect in the material of the object 125. By way of example, an at least partly cylindrical material region is used as the first material region 2007. In addition or as an alternative thereto, an at least partly conical material region is used as the first material region 2007.

By way of example, the region of interest 2006 is determined using the determination device 2002 with specified data about the object 125 or with data of a model of the object 125. By way of example, this embodiment of the method according to the system described herein is used if the structural build of the object 125 is known or approximately known. Then it is for example possible to accurately determine or approximately determine the position of the region of interest 2006 in or on the object 125. By way of example, the determined or suspected position of the region of interest 2006 is entered into the determination device 2002 and/or read from an external database.

A further embodiment of the method according to the system described herein additionally or alternatively provides for the region of interest 2006 to be determined using the determination device 2002 to perform a non-destructive examination. By way of example, the region of interest 2006 is determined using the x-ray device 2002A, using the ultrasound device 2002B and/or using the lock-in thermography device 2002C.

As mentioned above, the region of interest 2006 is arranged in or on the first material region 2007 of the object 125. The first material region 2007 adjoins a second material region 2009. By way of example, the second material region 2009 encompasses the first material region 2007 at least in part. In particular, provision is made for the second material region 2009 to fully encompass the first material region 2007.

Further, provision is made for the first material region 2007 to have a first portion 2007A and a second portion 2007B that adjoins the first portion 2007A. The region of interest 2006 is arranged in the first portion 2007A. By way of example, the second portion 2007B encompasses the first portion 2007A at least in part. In particular, provision is made for the second portion 2007B to fully encompass the first portion 2007A.

The embodiment of the method according to the system described herein now provides for method step S2 to be carried out after method step S1 or for method step S1A to be carried out first and then method step S2.

Figure 9:
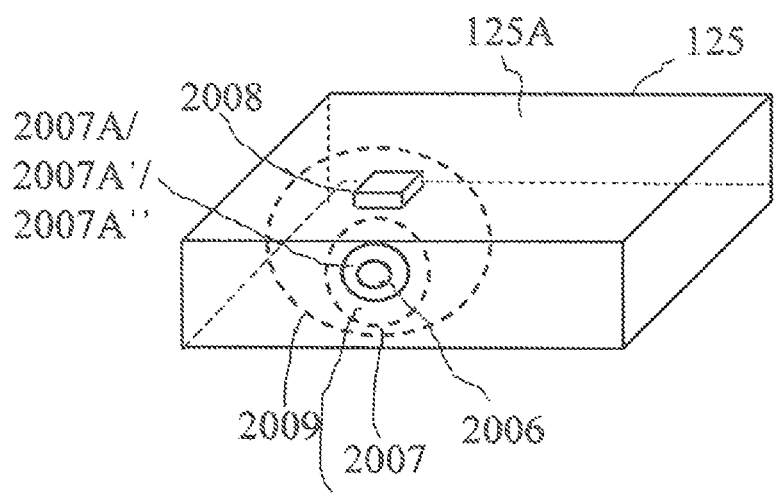
FIG. 9 shows a further schematic representation of an object with a region of interest according to the system described herein.

Method step S1A is explained first. In method step S1A, a marking is arranged on the object 125 by using the ion beam. FIG. 9 shows a schematic representation of the object 125, the schematic representation being based on FIG. 8. The same reference signs denote the same components. This embodiment of the method according to the system described herein is advantageous, in particular, if the region of interest 2006 is arranged in the first material region 2007 of the object 125, and not at the surface 125A of the object 125. To be able to recognize the approximate location of the region of interest 2006 in an image representation of the object 125, a marking 2008 is arranged at the surface 125A of the object 125 where the projection of the region of interest 2006 on the surface 125A is arranged. Alternatively, provision is made for the marking 2008 to be arranged on the surface 125A with an offset from the projection of the region of interest 2006 on the surface 125A. With regard to the projection, reference is made to the comments further above, which also apply here. Explicit reference is made to the fact that this embodiment of the method according to the system described herein can also be carried out if the region of interest 2006 is arranged on the surface 125A of the object 125. By way of example, provision is made for material deposition to be used as the marking 2008, with the material deposition being arranged at the surface 125A of the object 125 by the ion beam and/or the electron beam of the combination apparatus 200 using the gas feed device 1000. By way of example, the marking 2008 then also serves as a protective layer for the region of interest 2006 while the method is carried out. In addition or as an alternative thereto, provision is made for a material ablation to be used as the marking 2008, with the material ablation being generated by the ion beam and/or the electron beam of the combination apparatus 200.

To apply the marking 2008 to the surface 125A of the object 125, the gaseous precursor is guided for example by the gas feed device 1000 to the location on the surface 125A of the object 125 where the projection of the region of interest 2006 on the surface 125A is arranged. As mentioned above, phenanthrene for example is used as precursor. Essentially a layer of carbon or a carbon-containing layer then deposits on the surface 125A of the object 125. As an alternative thereto, by way of example, a precursor having metal can be used to deposit a metal or a metal-containing layer on the surface 125A of the object 125. However, the depositions are not limited to carbon and/or metals. Rather, any desired substances can be deposited on the surface 125A of the object 125, for example semiconductors, non-conductors or other compounds. Further, provision is also made for the precursor, while interacting with the electron beam and/or the ion beam, to be used to ablate material from the site of the surface 125A of the object 125 where the region of interest 2006 and/or the projection of the region of interest 2006 on the surface 125A of the object 125 are/is arranged.

In method step S2, material is then ablated from the second material region 2009 of the object 125 using the ablation device 2003 of the material processing device 2000. By way of example, the ablation device 2003 orients itself using coordinates of the sample stage 122 and/or the marking 2008. In particular, provision is made for the ablation device 2003 to scan a structure, for example in the form of a circular ring with a specifiable internal diameter and with a specifiable external diameter, and ablate into the depth, the center of the circular ring being the marking 2008. Reference is made to the fact that the invention is not restricted to the aforementioned structure. Instead, any structured that is suitable for the invention can be used for the invention. As mentioned above, the ablation device 2003 for example includes the laser device 2003A and/or the mechanical ablation device 2003B. By way of example, the mechanical ablation device 2003B is embodied as a microtome. In addition or as an alternative thereto in turn, provision is made for the ablation device 2003 to include the ion beam device 2003C with the high-current ion beam (for example ranging from 1 nA to 10 µA, the interval limits being included in the aforementioned interval). In addition or as an alternative thereto, the ion beam device 2003C is embodied as the plasma ion beam device 2003C with a plasma beam generator. In addition or as an alternative thereto in turn, the ablation device 2003 includes the beam device 2003D with a beam of neutral particles and/or the etching device 2003E for chemical etching. By way of example, provision is made for the material of the second material region 2009 of the object 125 to be ablated extensively in a few ablation steps, in particular of the order of several 100 µm. Expressed differently, the material in the second material region 2009 of the object 125 is ablated in a few coarse steps within the scope of the method step of the method according to the system described here, and so an extensive structure is generated in the object 125. By way of example, this structure has maximum dimensions of the order of several 100 µm. FIG. 10 shows a schematic representation of the object 125 after the second material region 2009 was extensively ablated. In this embodiment, the material of the second material region 2009 has been ablated around the first material region 2007 of the object 125, in such a way that a structure with a depth of approximately 120 µm and with a diameter of approximately 500 µm is formed in the object 125. The first material region 2007 is arranged approximately in the center of this structure. FIG. 11 shows a detailed representation of the first material region 2007, on which the marking 2008 has been arranged.

Figure 12:
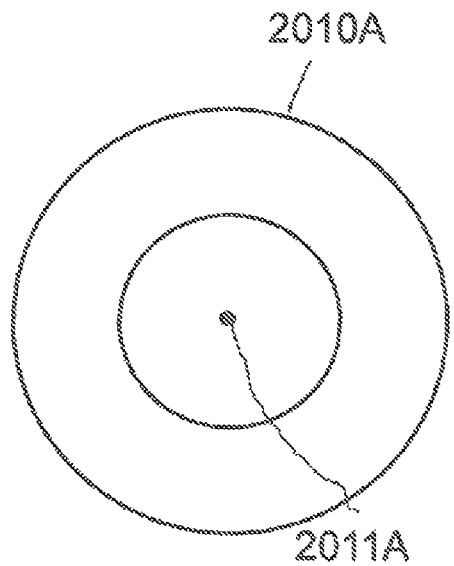
FIG. 12 shows a schematic representation of a first embodiment of a geometric shape according to the system described herein.
Figure 13:
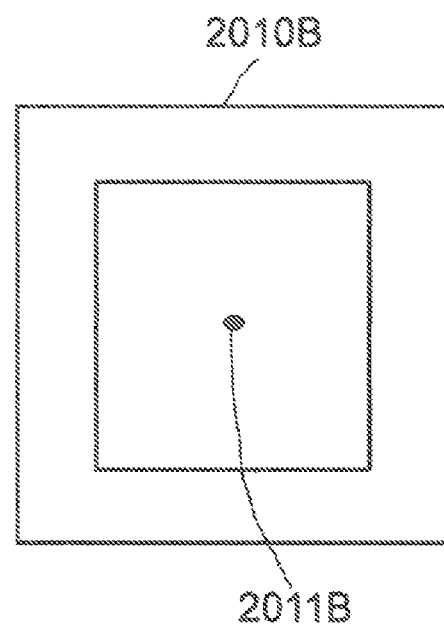
FIG. 13 shows a schematic representation of a second embodiment of a geometric shape according to the system described herein.
Figure 14:
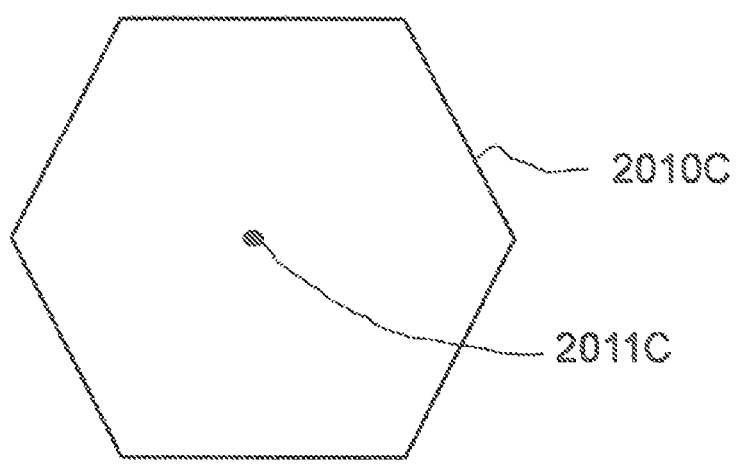
FIG. 14 shows a schematic representation of a third embodiment of a geometric shape according to the system described herein.

In method step S3, an expected geometric shape of the first material region 2007 is searched for in a plan view of the first material region 2007, following the ablation or during the ablation of the material from the second material region 2009, using the control unit 123. Subsequently, the geometric shape is recognized. By way of example, an image and/or pattern recognition method known from the prior art is used to this end. Expressed differently, the control unit 123 is used to determine the geometric shape of the first material region 2007 in a plan view of the first material region 2007 following the ablation or during the ablation of the material from the second material region 2009. With regard to the plan view, reference is made to the comments further above, which also apply here. By way of example, the geometric shape is recognized on account of imaging of the first material region 2007 by the electron beam and/or the ion beam of the combination apparatus 200. The geometric shape has a center. The center is arranged at a first position. Expressed differently, the center has a first relative position in space. By way of example, a two-dimensional shape is recognized as the geometric shape of the first material region 2007. In particular, the two-dimensional shape is a circular ring 2010A (cf. FIG. 12) and/or a frame-shaped structure 2010B (cf. FIG. 13), that is to say basically a shape with corners equivalent to the circular ring 2010A, and/or a polygon 2010C (cf. FIG. 14). However, the invention is not restricted to the aforementioned two-dimensional shapes. Rather, any two-dimensional shape which is suitable for the invention can be used for the invention. In addition or as an alternative thereto in turn, provision is made for a central point and/or a centroid to be used as the center 2011A, 2011B, 2011C of the geometric shape 2010A, 2010B, 2010C (cf. FIGS. 12 to 14). By way of example, the centroid is a centroid of an area. Alternatively, a point in the interior of the geometric shape 2010A, 2010B, 2010C is used as the center 2011A, 2011B, 2011C of the geometric shape 2010A, 2010B, 2010C, the point having a predetermined position relative to an edge of the geometric shape 2010A, 2010B, 2010C.

Now, the following applies with regard to the center 2011A, 2011B, 2011C:

What firstly applies, for example, is that the region of interest 2006 is arranged at the center 2011A to 2011C of the geometric shape 2010A to 2010C. Should the region of interest 2006 be arranged in the first material region 2007 of the object 125 (i.e., be arranged in the interior of the first material region 2007 of the object 125), provision is for example made for the projection of the region of interest 2006 on the surface 125A of the first material region 2007 of the object 125 to be arranged at the center 2011A to 2011C of the geometric shape 2010A to 2010C.

Secondly, if the region of interest 2006 or the projection of the region of interest 2006 on the surface 125A of the first material region 2007 is not arranged at the center 2011A, 2011B, 2011C of the geometric shape 2010A, 2010B, 2010C, the region of interest 2006 or the projection of the region of interest 2006 on the surface 125A of the first material region 2007 is defined as the center 2011A, 2011B, 2011C of the geometric shape 2010A, 2010B, 2010C and the geometric shape 2010A, 2010B, 2010C is arranged around the defined center 2011A, 2011B, 2011C.

Expressed differently, (a) the region of interest 2006 or a projection of the region of interest 2006 is already arranged at the center 2011A, 2011B, 2011C of the geometric shape 2010A, 2010B, 2010C or (b) the region of interest 2006 or its projection is defined as the center 2011A, 2011B, 2011C, about which the geometric shape 2010A, 2010B, 2010C is arranged.

By way of example, the aforementioned projection is a perpendicular projection of the region of interest 2006 on the surface 125A of the first material region 2007. In an alternative, the projection is a projection of the region of interest 2006 on the surface 125A of the first material region 2006 at any definable angle.

Method step S4 is carried out after method step S3 in this embodiment of the method according to the system described herein. Material is ablated from the second portion 2007B of the first material region 2007 using the ion beam of the combination apparatus 200 in method step S4, optionally with a gas being fed by the gas feed device 1000. Expressed differently, material is ablated from the second portion 2007B of the first material region 2007 using the ion beam of the combination apparatus 200, with material not being ablated from the first portion 2007A of the first material region 2007. Accordingly, no material is ablated from the region in which the region of interest 2006 is arranged (i.e., from the first portion 2007A of the first material region 2007). The material of the second portion 2007B of the first material region 2007 is ablated along the determined geometric shape 2010A to 2010C or along a further geometric shape that can be specified as desired. Expressed differently, the material is ablated from the second portion 2007B in such a way that the material is ablated from the second portion 2007B in the shape of the determined geometric shape 2010A to 2010C or a further geometric shape that can be specified as desired. By ablating the material from the second portion 2007B of the first material region 2007 along the determined geometric shape 2010A to 2010C or a further geometric shape that can be specified as desired, the first portion 2007A of the first material region 2007 is in principle exposed, the region of interest 2006 being arranged in the first portion 2007A of the first material region 2007 (cf. FIG. 15). The first portion 2007A has a first subregion and a second subregion, the region of interest being arranged in the first subregion. In principle, the aforementioned corresponds to a geometry as depicted in FIG. 9, with the first subregion being denoted by reference sign 2007A' and the second subregion being denoted by reference sign 2007B'. By way of example, the second subregion 2007B' encompasses the first subregion 2007A' at least in part. In particular, provision is made for the second subregion 2007B' to fully encompass the first subregion 2007A'.

In method step S5, a further geometric shape of the first material region 2007 is also recognized, following the ablation and/or during the ablation of the material from the second portion 2007B, in a plan view of the first material region 2007 using the control unit 123. By way of example, an image and/or pattern recognition method known from the prior art is used to this end. Expressed differently, the control unit 123 is used to search for and determine the further geometric shape of the first material region 2007 in a plan view of the first material region 2007, following the ablation and/or during the ablation of the material from the second portion 2007B. With regard to the plan view, reference is made to the comments further above, which also apply here. By way of example, the further geometric shape is recognized on account of imaging of the first material region 2007 by the electron beam and/or the ion beam of the combination apparatus 200. In particular, the further geometric shape is the outer shape of the first material region 2007 remaining following the ablation of the material from the second portion 2007B, and/or the further geometric shape is for example the marking 2008 of the region of interest 2006 or of the aforementioned projection of the region of interest 2006. The further geometric shape has a further center. The further center is arranged at a second position. Expressed differently, the further center has a second relative position in space. However, the further geometric shape has a smaller area than the aforementioned geometric shape, for example on account of a smaller diameter or a smaller area diagonal. By way of example, a two-dimensional shape is recognized as the further geometric shape of the first material region 2007. In particular, the two-dimensional shape is a circular ring 2010A (cf. FIG. 12) and/or a frame-shaped structure 2010B (cf. FIG. 13), that is to say basically a shape with corners equivalent to the circular ring 2010A, and/or a polygon 2010C (cf. FIG. 14). However, the invention is not restricted to the aforementioned two-dimensional shapes. Rather, any two-dimensional shape which is suitable for the invention can be used for the invention.

In method step S6, the object 125 is positioned using the object holder 114 and/or the ion beam is positioned using the ion beam apparatus 300, in such a way that the first position of the center corresponds to the second position of the further center so that one of the following features is applicable in respect of the further center: (i) the region of interest 2006 is arranged at the further center of the further geometric shape 2010A to 2010C or (ii) the projection of the region of interest 2006 on the surface 125 of the first material region 2007 is arranged at the further center of the further geometric shape 2010A to 2010C.

In method step S7, material is ablated from the second subregion 2007B' of the first material region 2007 using the ion beam of the ion beam apparatus 300, the material of the second subregion 2007B' of the first material region 2007 being ablated for example along the further geometric shape or a further geometric shape that can be specified as desired in turn. The first subregion 2007A' is not ablated in the process.

Now, a check is carried out in method step S8 as to whether the specified number of iteration steps and/or the desired end shape of the object 125 resulting from the processing of the object 125 have/has been obtained. If the desired end shape of the object 125 and/or the specified number of iteration steps have/has not yet been obtained, method steps S5 to S8 are repeated. In this case, the material of the remaining first material region 2007—for example the first subregion 2007A'—is ablated further, with for example the current and the energy of the ion beam incrementally decreasing during each iteration of steps S5 to S8. This is explained below.

When method step S5 is carried out again, a yet further geometric shape of the first material region 2007 is recognized, following the ablation and/or during the ablation of the material from the second subregion 2007B', in a plan view of the first material region 2007 using the control unit 123. By way of example, an image and/or pattern recognition method known from the prior art is used to this end. Expressed differently, the control unit 123 is used to search for a yet further geometric shape and determine the yet further geometric shape of the first material region 2007 in a plan view of the first material region 2007, following the ablation and/or during the ablation of the material from the second subregion 2007B'. By way of example, the yet further geometric shape is recognized using imaging of the first material region 2007 by the electron beam and/or the ion beam of the combination apparatus 200. In particular, the yet further geometric shape is the outer shape of the first material region 2007 remaining following the ablation of the material from the second subregion 2007B', and/or the yet further geometric shape is for example the marking 2008 of the region of interest 2006 or of the aforementioned projection of the region of interest 2006. The yet further geometric shape has a yet further center. The yet further center is arranged at a third position. Expressed differently, the yet further center has a third relative position in space. However, the yet further geometric shape has a smaller area than the further geometric shape recognized in the previously carried out method step S5, for example on account of a smaller diameter or a smaller area diagonal. By way of example, a two-dimensional shape is recognized as the yet further geometric shape of the first material region 2007. In particular, the two-dimensional shape is a circular ring 2010A (cf. FIG. 12) and/or a frame-shaped structure 2010B (cf. FIG. 13), that is to say basically a shape with corners equivalent to the circular ring 2010A, and/or a polygon 2010C (cf. FIG. 14). However, the invention is not restricted to the aforementioned two-dimensional shapes. Rather, any two-dimensional shape which is suitable for the invention can be used for the invention.

In method step S6, the object 125 is positioned using the object holder 114 and/or the ion beam is positioned using the ion beam apparatus 300, in such a way that the second position of the further center corresponds to the third position of the yet further center so that one of the following features is applicable in respect of the yet further center: (i) the region of interest 2006 is arranged at the yet further center of the yet further geometric shape 2010A to 2010C or (ii) the projection of the region of interest 2006 on the surface 125 of the first material region 2007 is arranged at the yet further center of the yet further geometric shape 2010A to 2010C.

In method step S7, material is now ablated from a further second subregion 2007B" of the first material region 2007 using the ion beam of the ion beam apparatus 300, the material of the further second subregion 2007B" of the first material region 2007 being ablated for example along the further geometric shape or a further geometric shape that can be specified as desired. As mentioned above, a current that is lower than the current of the ion beam used during the previous iteration of method step S7 is generally chosen for the current of the ion beam. The first subregion 2007A has a further first subregion 2007A" and the aforementioned further second subregion 2007B", the region of interest 2006 being arranged in the further first subregion 2007A". In principle, the aforementioned corresponds to a geometry as depicted in FIG. 9, with the further first subregion being denoted by reference sign 2007A" and the further second subregion being denoted by reference sign 2007B". By way of example, the further second subregion 2007B" encompasses the further first subregion 2007A" at least in part. In particular, provision is made for the further second subregion 2007B" to fully encompass the further first subregion 2007A'. The further first subregion 2007A" is not ablated in the method step S7.

Now, a check is carried out in method step S8 as to whether a specified number of iteration steps and/or the desired end shape of the object 125 resulting from the processing of the object 125 have/has been obtained. Method steps S5 to S8 are repeated if the desired end shape of the object 125 has not yet been obtained and/or the iteration has not yet been completed as further steps should still be carried out.

By way of example, when method steps S3 to S5 are run through again, the ablation of the material from the first material region 2007 in the form of hollow cylinders with reducing diameters and heights is chosen such that, in particular, a tip is generated in the first material region 2007 of the object 125. As mentioned above, a check is carried out in method step S8 as to whether the specified number of iteration steps and/or the desired end shape of the first material region 2007 of the object 125 have/has been achieved. Should this be the case, the first material region 2007 for example has the shape of a tip with a tip radius of the order of 10 nm to 100 nm, for example. This is depicted schematically in FIG. 16.

In an embodiment of the method according to the system described herein, the tip of the object 125 is analyzed using atom probe tomography in the combination apparatus 200 (method step S9). To this end, an electric field with a voltage whose field strength just does not suffice to bring about a detachment of atoms from the tip is applied to the tip in the combination apparatus 200. Now a short voltage pulse is applied to the tip in addition to the aforementioned voltage. This causes an increase in the field strength, the latter then being sufficient to detach individual ions at the tip by field evaporation. The use of a short laser pulse as an alternative to the short voltage pulse is also known. An atom that has been detached as a charged ion is steered to a position-sensitive detector by the electric field. Since the time of the voltage pulse or the laser pulse is known, the time at which the ion was detached from the tip is also known. Then, the mass of the ion can be determined from a time of flight, to be determined, of the ion from the tip to the detector. The x- and y-position of the atom at the tip can be determined from the location of incidence of the ion on the position-sensitive detector. The z-position of the atom in the tip is determined with knowledge of the evaporation sequence carried out. Expressed differently, ions striking the position-sensitive detector at a later time are arranged further within the tip than ions striking the position-sensitive detector at an earlier time.

Alternatively, the object 125 is removed and introduced into an examination device, in which the tip is then analyzed using atom probe tomography.

Figure 17:
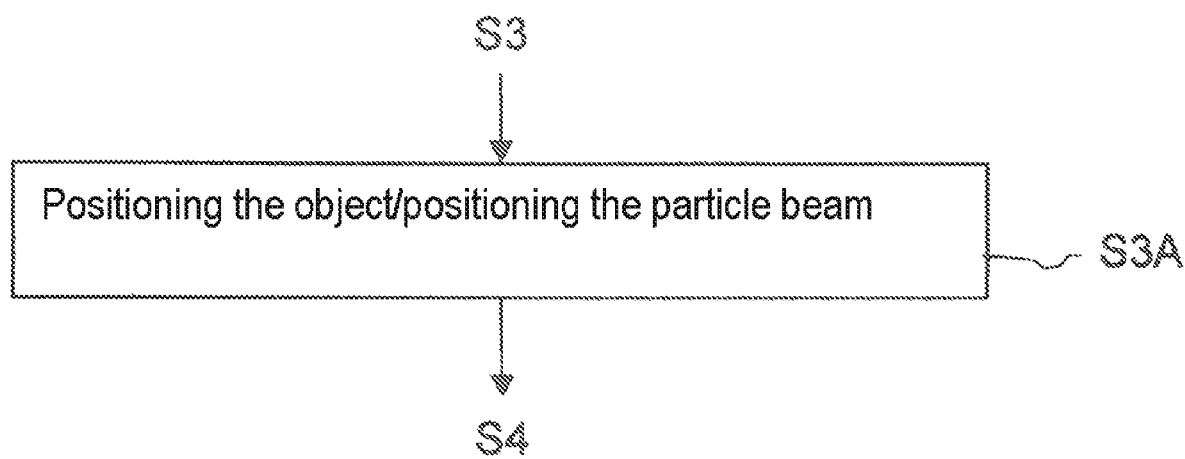
FIG. 17 shows a schematic representation of a further embodiment of a method according to the system described herein.

FIG. 17 shows a further embodiment of the method according to the system described herein. The embodiment of the method according to the system illustrated in FIG. 17 is based on the embodiment of the method according to the system illustrated in FIG. 7. Therefore, reference is made to the explanations given above. The explanations given above also apply to the method according to the system illustrated in accordance with FIG. 17. In contrast to the embodiment of the method according to the system illustrated in accordance with FIG. 7, the embodiment of the method according to the system illustrated in accordance with FIG. 17 includes method step S3A, which is carried out after method step S3. In method step S3A the object 125 is positioned using the moveable object holder 114 and/or the ion beam is positioned using the combination apparatus 200 following the recognition of the geometric shape of the first material region 2006, in such a way that the ion beam is directed at the first material region 2007. In particular, provision is made for the object 125 and/or the ion beam to be positioned using at least one structure that has arisen when ablating the material from the second material region 2009 of the object 125 using the ablation device 2003, the structure being formed as a marking. Expressed differently, at least one structure is used as a marking in this embodiment of the method according to the system described herein, in order to position the object 125 and/or the ion beam, to be precise in such a way that, for example, the ion beam is directed at the first material region 2007. Following the step S3A, method step S4 is carried out.

Firstly, the system described herein ensures extensive ablation of material of the object 125 for example of the order of several 100 µm using the ablation device 2003. In particular, the system described herein ensures the material of the second material region 2009 of the object 125 is ablated extensively in a few ablation steps, for example of the order of several 100 µm. Expressed differently, the material in the second material region 2009 of the object 125 is ablated in a few coarse steps within the scope of the method according to the system described herein and so an extensive structure is generated in the object 125. By way of example, this structure has dimensions of the order of several 100 µm. Secondly, the system described herein ensures for example automated fine ablation of material from the second portion 2007B of the first material region 2007, of the order of several nm to several µm, using the ion beam of the combination apparatus 200, with the first portion 2007A, in which the region of interest 2006 is arranged, not being ablated. Consequently, the time taken for production of a determined shape of the object 125, for example a tip of the object 125 for the purposes of analysis using atom probe tomography, can be reduced in comparison with the prior art, for example to minutes or a few hours. Further, the system described herein facilitates determination of the geometric form and the centration of the region of interest 2006 or the projection of the region of interest 2006 at the center 2011A to 2011C of the geometric shape 2010A to 2010C, such that adequate relative positioning of the electron beam and/or of the ion beam relative to the object 125 is made possible without a reference marking necessarily having to be arranged on the object 125. The system described herein ensures production of any shape of the object 125 by processing the object 125 within a relatively short period of time, in particular production of a tip of the object 125 which is then analyzable using atom probe tomography, for example.

The system described herein also takes into account that the object 125 is processed multiple times for the purposes of producing a desired shape of the object 125. On account of mechanical and/or electronic drifts of components of the material processing device 2000 and/or the choice of different ablation conditions in the material processing device 2000, the relative position of the region of interest 2006 may change in relation to the ion beam of the combination apparatus 200 while the method according to the system described herein is carried out. If the object 125 is processed multiple times, this may possibly lead to a non-desired shape of the object 125 being produced following processing without appropriate position correction or drift correction. As a result of recognizing the geometric shapes and arranging the center of the geometric shapes at a position, the system described herein, in particular, provides a solution that considers such drifts without use of a reference marking being mandatory.

None of the described embodiments of the method according to the invention are restricted to the aforementioned sequence of the explained method steps. Rather, any sequence of the aforementioned method steps suitable for the invention can be chosen in the method according to the invention.

The features of the invention disclosed in the present description, in the drawings and in the claims may be essential for the realization of the invention in the various embodiments thereof both individually and in arbitrary combinations. The invention is not restricted to the described embodiments. The invention can be varied within the scope of the claims and taking into account the knowledge of the relevant person skilled in the art.

The invention claimed is:

1. A method for processing an object using a material processing device, comprising:
   determining a region of interest of the object arranged on or in a first material region of the object using a determination device of the material processing device;
   ablating material from a second material region of the object using an ablation device of the material processing device, the second material region adjoining the first material region, the first material region having a first portion and a second portion adjoining the first portion, and the region of interest being arranged in the first portion;
   recognizing a geometric shape of the first material region, following the ablation and/or during the ablation of the material from the second material region, in a plan view of the first material region using a control device of the material processing device, the geometric shape having a center, the center being arranged at a first position, wherein either the region of interest is arranged at the center of the geometric shape or a projection of the region of interest on a surface of the first material region is arranged at the center of the geometric shape;
   ablating material from the second portion of the first material region using a particle beam of a particle beam apparatus, the first portion having a first subregion and a second subregion, the region of interest being arranged in the first subregion;
   recognizing a further geometric shape of the first material region, following the ablation of the material from the first portion, in a plan view of the first material region using the control device of the material processing device, the further geometric shape having a further center, the further center being arranged at a second position;
   positioning the object using a moveable object holder and/or positioning the particle beam using the particle beam apparatus, in such a way that the first position of the center corresponds to the second position of the further center, wherein the region of interest is arranged at the further center of the further geometric shape or a projection of the region of interest on the surface of the first material region is arranged at the further center of the further geometric shape; and
   ablating material from the second subregion of the first material region using the particle beam of the particle beam apparatus.

2. The method as claimed in claim 1, wherein only material from the second portion and/or from the second subregion of the first material region is ablated using the particle beam of the particle beam apparatus.

3. The method as claimed in claim 1, wherein the region of interest of the object is determined using at least one of:
   the determination device with specified data about the object;
   the determination device with a specified model of the object;
   the determination device with a non-destructive examination;
   the determination device with an x-ray device;
   the determination device with an ultrasound device;
   the determination device with a lock-in thermography device.

4. The method as claimed in claim 1, wherein ablation of the material from the second material region is implemented using at least one of the following steps:
   the ablation device includes a laser device and the material is ablated from the second material region using the laser device;
   the ablation device includes a mechanical ablation device and the material is ablated from the second material region using the mechanical ablation device;
   the ablation device includes an ion beam device and the material is ablated from the second material region using the ion beam device;
   the ablation includes a plasma ion beam device with a plasma beam generator and the material is ablated from the second material region using the plasma ion beam device;
   the ablation device includes a beam device with a beam of neutral particles and the material is ablated from the second material region using the beam device;
   the ablation device includes an etching device for chemical etching and the material is ablated from the second material region using the etching device.

5. The method as claimed in claim 1, wherein the first material region is one of an at least partly cylindrical material region or an at least partly conical material region and/or the second material region is one of an at least partly ring-shaped material region or an at least partly hollow-cylindrical material region.

6. The method as claimed in claim 1, further comprising:
   using a two-dimensional shape as the geometric shape and/or the further geometric shape for the first material region.

7. The method as claimed in claim 1, wherein the particle beam apparatus includes an ion beam apparatus and an ion beam of the ion beam apparatus is used to ablate material from the second portion of the first material region.

8. The method as claimed in claim 1, wherein at least one marking is arranged on the first material region in the center of the geometric shape using the particle beam apparatus.

9. The method as claimed in claim 8, wherein a material deposition is used as marking, the material deposition being arranged on the first material region by the particle beam apparatus using a gas device.

10. The method as claimed in claim 1, wherein the object is positioned using the moveable object holder and/or the particle beam is positioned using the particle beam apparatus following recognition of the geometric shape of the first material region, in such a way that the particle beam is directed at the center of the first material region.

11. The method as claimed in claim 10, wherein the object and/or the particle beam is positioned using at least one structure that arises when ablating the material from the second material region of the object using the ablation device, the structure being formed as a marking.

12. The method as claimed in claim 1, wherein the object is analyzed and/or the method is stopped after a final shape of the first material region has been obtained.

13. A non-transitory computer readable medium containing software that, when executed, controls a material processing device to perform the following steps:
   determining a region of interest of the object arranged on or in a first material region of the object using a determination device of the material processing device;
   ablating material from a second material region of the object using an ablation device of the material processing device, the second material region adjoining the first material region, the first material region having a first portion and a second portion adjoining the first portion, and the region of interest being arranged in the first portion;
recognizing a geometric shape of the first material region, following the ablation and/or during the ablation of the material from the second material region, in a plan view of the first material region using a control device of the material processing device, the geometric shape having a center, the center being arranged at a first position, wherein either the region of interest is arranged at the center of the geometric shape or a projection of the region of interest on a surface of the first material region is arranged at the center of the geometric shape;
ablating material from the second portion of the first material region using a particle beam of a particle beam apparatus, the first portion having a first subregion and a second subregion, the region of interest being arranged in the first subregion;
recognizing a further geometric shape of the first material region, following the ablation of the material from the first portion, in a plan view of the first material region using the control device of the material processing device, the further geometric shape having a further center, the further center being arranged at a second position;
positioning the object using a moveable object holder and/or positioning the particle beam using the particle beam apparatus, in such a way that the first position of the center corresponds to the second position of the further center, wherein the region of interest is arranged at the further center of the further geometric shape or a projection of the region of interest on the surface of the first material region is arranged at the further center of the further geometric shape; and
ablating material from the second subregion of the first material region using the particle beam of the particle beam apparatus.

14. A material processing device for processing an object, comprising
at least one movable object holder for arranging the object;
at least one determination device for determining a region of interest of the object;
at least one ablation device for ablating material;
at least one particle beam apparatus having at least one beam generator for generating a particle beam of charged particles, at least one objective lens for focusing the particle beam on the object, at least one scanning device for scanning the particle beam over the object, at least one detector for detecting interaction particles and/or interaction radiation arising from an interaction of the particle beam with the object, and at least one display device for displaying an image and/or an analysis of the object and;
at least one control unit having a processor coupled to non-transitory computer readable medium and containing software that, when executed, performs the following steps:
determining a region of interest of the object arranged on or in a first material region of the object using a determination device of the material processing device;
ablating material from a second material region of the object using an ablation device of the material processing device, the second material region adjoining the first material region, the first material region having a first portion and a second portion adjoining the first portion, and the region of interest being arranged in the first portion;
recognizing a geometric shape of the first material region, following the ablation and/or during the ablation of the material from the second material region, in a plan view of the first material region using a control device of the material processing device, the geometric shape having a center, the center being arranged at a first position, wherein either the region of interest is arranged at the center of the geometric shape or a projection of the region of interest on a surface of the first material region is arranged at the center of the geometric shape;
ablating material from the second portion of the first material region using a particle beam of a particle beam apparatus, the first portion having a first subregion and a second subregion, the region of interest being arranged in the first subregion;
recognizing a further geometric shape of the first material region, following the ablation of the material from the first portion, in a plan view of the first material region using the control device of the material processing device, the further geometric shape having a further center, the further center being arranged at a second position;
positioning the object using a moveable object holder and/or positioning the particle beam using the particle beam apparatus, in such a way that the first position of the center corresponds to the second position of the further center, wherein the region of interest is arranged at the further center of the further geometric shape or a projection of the region of interest on the surface of the first material region is arranged at the further center of the further geometric shape; and
ablating material from the second subregion of the first material region using the particle beam of the particle beam apparatus.

15. The material processing device as claimed in claim 14, wherein the ablation device is implemented using at least one of the following:
at least one laser device;
at least one mechanical ablation device;
at least one ion beam device;
at least one plasma ion beam device (2003C) with a plasma beam generator;
at least one beam device with a beam of neutral particles;
at least one etching device for chemical etching.

16. The material processing device as claimed in claim 14, wherein the beam generator is a first beam generator and the particle beam is a first particle beam with first charged particles, wherein the objective lens is a first objective lens for focusing the first particle beam onto the object, and wherein the particle beam apparatus further comprises:
at least one second beam generator for generating a second particle beam that include second charged particles; and
at least one second objective lens that focuses the second particle beam onto the object.

17. The material processing device as claimed in claim 14, wherein the particle beam apparatus is an electron beam apparatus and/or an ion beam apparatus.

18. The material processing device as claimed in claim 14, wherein the material processing device is the particle beam apparatus.

19. The method as claimed in claim 1, further comprising:
using a central point as the center of the geometric shape and/or as the further center of the further geometric shape.

20. The method as claimed in claim 1, further comprising:
using a centroid as the center of the geometric shape and/or as the further center of the further geometric shape.

21. The method as claimed in claim 1, further comprising:
using a centroid of an area as the center of the geometric shape and/or as the further center of the further geometric shape.

22. The method as claimed in claim 1, further comprising:
using a point in the interior of the geometric shape and/or in the interior of the further geometric shape as the center of the geometric shape and/or as the further center of the further geometric shape, the point having a predetermined position relative to an edge of the geometric shape and/or of the further geometric shape.

23. The method as claimed in claim 8, wherein a material ablation is used as a marking, the material ablation being generated by the particle beam apparatus.

24. A method for processing an object using a material processing device, comprising:
determining a region of interest of the object arranged on or in a first material region of the object using a determination device of the material processing device;
ablating material from a second material region of the object using an ablation device of the material processing device, the second material region adjoining the first material region, the first material region having a first portion and a second portion adjoining the first portion, and the region of interest being arranged in the first portion;
recognizing a geometric shape of the first material region, following the ablation and/or during the ablation of the material from the second material region, in a plan view of the first material region using a control device of the material processing device, the geometric shape having a center, the center being arranged at a first position, wherein if the region of interest or the projection of the region of interest on the surface of the first material region is not arranged at the center of the geometric shape, defining the region of interest or the projection of the region of interest on the surface of the first material region as the center of the geometric shape and defining the arrangement of the geometric shape with the now defined center around the defined center;
ablating material from the second portion of the first material region using a particle beam of a particle beam apparatus, the first portion having a first subregion and a second subregion, the region of interest being arranged in the first subregion;
recognizing a further geometric shape of the first material region, following the ablation of the material from the first portion, in a plan view of the first material region using the control device of the material processing device, the further geometric shape having a further center, the further center being arranged at a second position;
positioning the object using a moveable object holder and/or positioning the particle beam using the particle beam apparatus, in such a way that the first position of the center corresponds to the second position of the further center, wherein the region of interest is arranged at the further center of the further geometric shape or a projection of the region of interest on the surface of the first material region is arranged at the further center of the further geometric shape; and
ablating material from the second subregion of the first material region using the particle beam of the particle beam apparatus.

25. A non-transitory computer readable medium containing software that, when executed, controls a material processing device to perform the following steps:
determining a region of interest of the object arranged on or in a first material region of the object using a determination device of the material processing device;
ablating material from a second material region of the object using an ablation device of the material processing device, the second material region adjoining the first material region, the first material region having a first portion and a second portion adjoining the first portion, and the region of interest being arranged in the first portion;
recognizing a geometric shape of the first material region, following the ablation and/or during the ablation of the material from the second material region, in a plan view of the first material region using a control device of the material processing device, the geometric shape having a center, the center being arranged at a first position, wherein if the region of interest or the projection of the region of interest on the surface of the first material region is not arranged at the center of the geometric shape, defining the region of interest or the projection of the region of interest on the surface of the first material region as the center of the geometric shape and defining the arrangement of the geometric shape with the now defined center around the defined center;
ablating material from the second portion of the first material region using a particle beam of a particle beam apparatus, the first portion having a first subregion and a second subregion, the region of interest being arranged in the first subregion;
recognizing a further geometric shape of the first material region, following the ablation of the material from the first portion, in a plan view of the first material region using the control device of the material processing device, the further geometric shape having a further center, the further center being arranged at a second position;
positioning the object using a moveable object holder and/or positioning the particle beam using the particle beam apparatus, in such a way that the first position of the center corresponds to the second position of the further center, wherein the region of interest is arranged at the further center of the further geometric shape or a projection of the region of interest on the surface of the first material region is arranged at the further center of the further geometric shape; and
ablating material from the second subregion of the first material region using the particle beam of the particle beam apparatus.

26. A material processing device for processing an object, comprising
at least one movable object holder for arranging the object;
at least one determination device for determining a region of interest of the object;
at least one ablation device for ablating material;
at least one particle beam apparatus having at least one beam generator for generating a particle beam of charged particles, at least one objective lens for focusing the particle beam on the object, at least one scanning device for scanning the particle beam over the object, at least one detector for detecting interaction particles and/or interaction radiation arising from an interaction of the particle beam with the object, and at least one display device for displaying an image and/or an analysis of the object and;

at least one control unit having a processor coupled to non-transitory computer readable medium and containing software that, when executed, performs the following steps:

determining a region of interest of the object arranged on or in a first material region of the object using a determination device of the material processing device;

ablating material from a second material region of the object using an ablation device of the material processing device, the second material region adjoining the first material region, the first material region having a first portion and a second portion adjoining the first portion, and the region of interest being arranged in the first portion;

recognizing a geometric shape of the first material region, following the ablation and/or during the ablation of the material from the second material region, in a plan view of the first material region using a control device of the material processing device, the geometric shape having a center, the center being arranged at a first position, wherein if the region of interest or the projection of the region of interest on the surface of the first material region is not arranged at the center of the geometric shape, defining the region of interest or the projection of the region of interest on the surface of the first material region as the center of the geometric shape and defining the arrangement of the geometric shape with the now defined center around the defined center;

ablating material from the second portion of the first material region using a particle beam of a particle beam apparatus, the first portion having a first subregion and a second subregion, the region of interest being arranged in the first subregion;

recognizing a further geometric shape of the first material region, following the ablation of the material from the first portion, in a plan view of the first material region using the control device of the material processing device, the further geometric shape having a further center, the further center being arranged at a second position;

positioning the object using a moveable object holder and/or positioning the particle beam using the particle beam apparatus, in such a way that the first position of the center corresponds to the second position of the further center, wherein the region of interest is arranged at the further center of the further geometric shape or a projection of the region of interest on the surface of the first material region is arranged at the further center of the further geometric shape; and ablating material from the second subregion of the first material region using the particle beam of the particle beam apparatus.

* * * * *